US011294121B2

(12) United States Patent
Lee et al.

(10) Patent No.: US 11,294,121 B2
(45) Date of Patent: Apr. 5, 2022

(54) OPTICAL DEVICE AND METHOD OF FABRICATING THE SAME

(71) Applicant: KOREA ADVANCED INSTITUTE OF SCIENCE AND TECHNOLOGY, Daejeon (KR)

(72) Inventors: Hansuek Lee, Daejeon (KR); Daegon Kim, Daejeon (KR); Sangyoon Han, Daejeon (KR); Joonhyuk Hwang, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 63 days.

(21) Appl. No.: 16/839,560

(22) Filed: Apr. 3, 2020

(65) Prior Publication Data

US 2020/0319406 A1  Oct. 8, 2020

(30) Foreign Application Priority Data

Apr. 5, 2019 (KR) .................. 10-2019-0040147

(51) Int. Cl.
*G02B 6/12* (2006.01)
*G02B 6/136* (2006.01)
(Continued)

(52) U.S. Cl.
CPC ............. *G02B 6/136* (2013.01); *C23C 14/10* (2013.01); *G02B 6/02* (2013.01); *G02B 2006/12038* (2013.01)

(58) Field of Classification Search
CPC ................. G02B 6/136; G02B 6/02; G02B 2006/12038; G02B 6/122; G02B 6/132;
(Continued)

(56) References Cited

U.S. PATENT DOCUMENTS 6,946,238 B2    9/2005   Zhang et al.
7,103,252 B2 *  9/2006   Ide .................. G02B 6/132
                                              385/131
(Continued)

OTHER PUBLICATIONS

William Vis, Self-Aligned Chip-to-Chip Optical Interconnections in Ultra-Thin 3D Glass Interposers, 2015, Electronic Components & Technology Conference, pp. 804-809 (Year: 2015).*
(Continued)

*Primary Examiner* — Jennifer Doan
(74) *Attorney, Agent, or Firm* — Harness, Dickey & Pierce, P.L.C.

(57) ABSTRACT

The present invention relates to an optical device comprising a first sub-chip and a second sub-chip flipped over on the first sub-chip. The first sub-chip includes a first substrate, a first lower cladding pattern on a first surface of the first substrate, and a first core layer on the first lower cladding pattern. The second sub-chip includes a second substrate, a second lower cladding pattern on a second surface of the second substrate, and a second core layer on the second lower cladding pattern. The first surface of the first substrate faces the second surface of the second substrate. The first lower cladding pattern has a first top surface parallel to the first surface and a first sidewall inclined to the first surface. The first core layer includes a first core part on the first top surface and a first side part on the first sidewall.

20 Claims, 21 Drawing Sheets

(51) Int. Cl.
*G02B 6/02* (2006.01)
*C23C 14/10* (2006.01)

(58) Field of Classification Search
CPC .. G02B 2006/12097; G02B 6/12; C23C 14/10
See application file for complete search history.

(56) References Cited

U.S. PATENT DOCUMENTS

| | | |
|---|---|---|
| 7,469,558 B2 | 12/2008 | Demaray et al. |
| 7,664,352 B1 * | 2/2010 | Okayama ............. G02B 6/1228 385/43 |
| 2010/0142904 A1 * | 6/2010 | Yanagisawa ........... G02B 6/138 385/131 |
| 2016/0327743 A1 | 11/2016 | Kippenberg et al. |

OTHER PUBLICATIONS

"On-Chip Stimulated Brillouin Lasers Based on Chalcogenide Glass Resonators with 10 Million Q-factor", Department of Physics, Korea Advanced Institute of Science and Technology, Laser Physics Centre, Research School of Physics and Engineering, The Australian National University: Han, et al. 2019.

* cited by examiner

OPTICAL DEVICE AND METHOD OF FABRICATING THE SAME

CROSS-REFERENCE TO RELATED APPLICATION

This U.S. nonprovisional application claims priority under 35 U.S.C. § 119 to Korean Patent Application No. 10-2019-0040147 filed on Apr. 5, 2019 in the Korean Intellectual Property Office, the disclosure of which is hereby incorporated by reference in its entirety.

BACKGROUND

The present inventive concepts relate to an optical device and a method of fabricating the same.

With the development of optical communication technology, techniques have been studied for optical devices including optical splitters, optical couplers, optical switches, optical wavelength dividers, and optical amplifiers. In general, to achieve optical devices on chips based on specific materials, an etching process is required to pattern a material after the deposition of the material on a substrate. The optical loss of the optical device is mainly determined by optical adsorption of deposited material and scattering caused by surface roughness of the optical device. In particular, the scattering due to the surface roughness is a main factor to determine the optical loss. The surface roughness of the optical device is chiefly originated from the etching process on the deposited material. In the case the deposited material is not silicon, silicon nitride, or silicon oxide widely used for semiconductor processes, it is much likely that no optimization is often achieved in the etching process. Therefore, after the etching process, an extremely poor surface roughness occurs to dramatically reduce optical characteristics of the optical device.

SUMMARY

Some example embodiments of the present inventive concepts provide an optical device with improved optical characteristics.

Some example embodiments of the present inventive concepts provide a method of fabricating an optical device with improved optical characteristics.

According to some example embodiments of the present inventive concepts, an optical device may comprise a first sub-chip and a second sub-chip flipped over on the first sub-chip. The first sub-chip may include a first substrate, a first lower cladding pattern on a first surface of the first substrate, and a first core layer on the first lower cladding pattern. The second sub-chip may include a second substrate, a second lower cladding pattern on a second surface of the second substrate, and a second core layer on the second lower cladding pattern. The first surface of the first substrate may face the second surface of the second substrate. The first lower cladding pattern may have a first top surface parallel to the first surface and a first sidewall inclined to the first surface. The first core layer may include a first core part on the first top surface and a first side part on the first sidewall.

According to some example embodiments of the present inventive concepts, an optical device may comprise a first sub-chip and a second sub-chip flipped over on the first sub-chip. The first sub-chip may include a first substrate, a first lower cladding pattern on a first surface of the first substrate, and a first core layer on the first lower cladding pattern. The second sub-chip may include a second substrate, a second lower cladding pattern on a second surface of the second substrate, and a second core layer on the second lower cladding pattern. The first surface of the first substrate may face the second surface of the second substrate. A width of the first lower cladding pattern may decrease as approaching the second substrate. A width of the second lower cladding pattern may decrease as approaching the first substrate. A core part of the first core layer may be adjacent to a core part of the second core layer.

According to some example embodiments of the present inventive concepts, an optical device may comprise: a lower cladding pattern on a substrate; and a core layer on the lower cladding pattern. The lower cladding pattern may have a top surface parallel to a top surface of the substrate and a sidewall inclined to the top surface of the substrate. The core layer may have a core part on the top surface of the lower cladding pattern and a side part on the sidewall of the lower cladding pattern. The core layer may include a first core layer and a second core layer. The first core layer of the core part may have a first thickness. The first core layer of the side part may have a second thickness in a direction perpendicular to the sidewall. The first thickness may be greater than the second thickness.

DETAILED DESCRIPTION OF EMBODIMENTS

Figure 1:
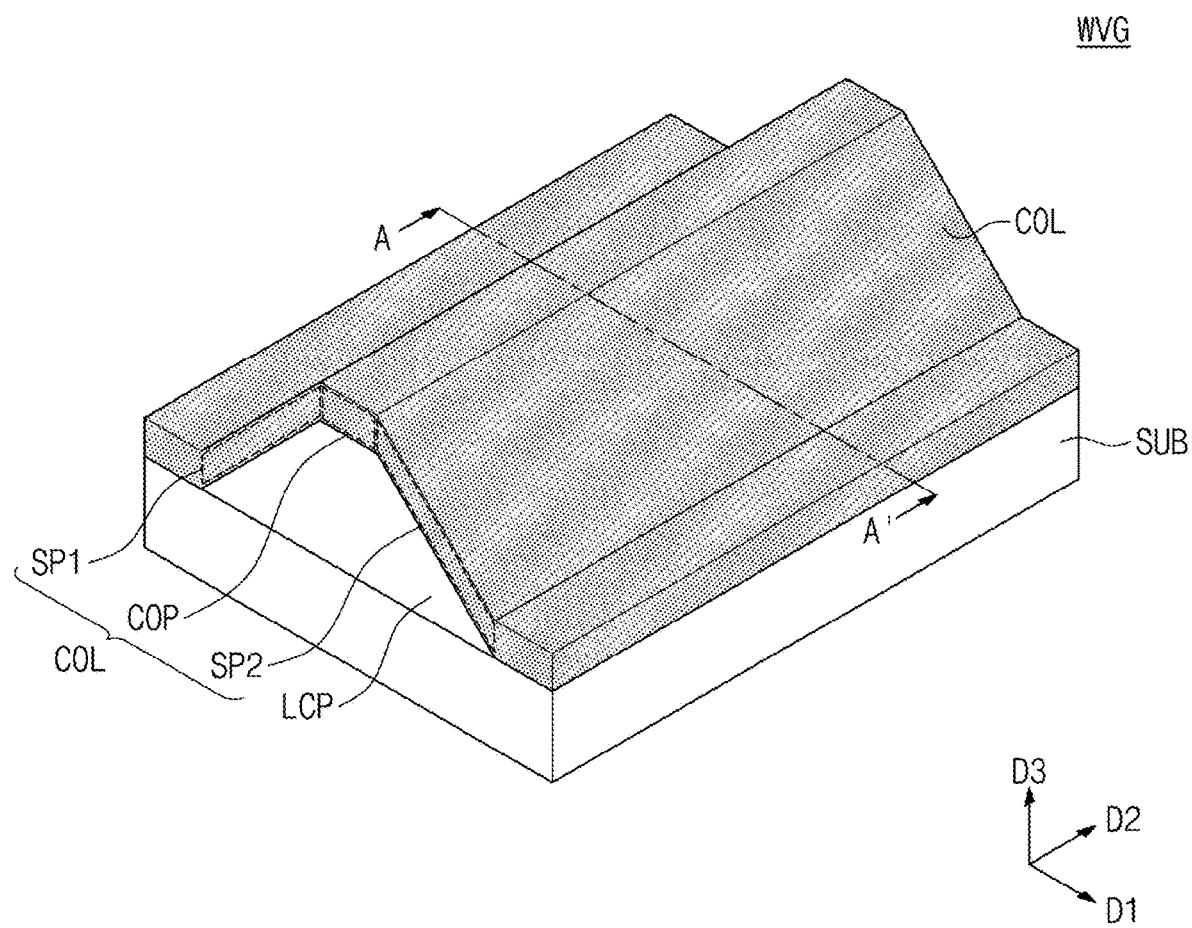
FIG. 1 illustrates a perspective view showing an optical device according to some example embodiments of the present inventive concepts.

In order to sufficiently understand the configuration and effect of the present inventive concepts, some example embodiments of the present inventive concepts will be described with reference to the accompanying drawings. It should be noted, however, that the present inventive concepts are not limited to the following exemplary embodiments, and may be implemented in various forms. Rather, the exemplary embodiments are provided only to disclose the present inventive concepts and let those skilled in the art fully know the scope of the present inventive concepts.

In this description, it will be understood that, when an element is referred to as being on another element, the element can be directly on the other element or intervening elements may be present between therebetween. In the drawings, thicknesses of some components are exaggerated for effectively explaining the technical contents. Like reference numerals refer to like elements throughout the specification.

Some example embodiments detailed in this description will be discussed with reference to sectional and/or plan views as ideal exemplary views of the present inventive concepts. In the drawings, thicknesses of layers and regions are exaggerated for effectively explaining the technical contents. Accordingly, regions exemplarily illustrated in the drawings have general properties, and shapes of regions exemplarily illustrated in the drawings are used to exemplarily disclose specific shapes but not limited to the scope of the present inventive concepts. It will be understood that, although the terms "first", "second", "third", etc. may be used herein to describe various elements, these elements should not be limited by these terms. These terms are only used to distinguish one element from another element. The some example embodiments explained and illustrated herein include complementary embodiments thereof.

The terminology used herein is for the purpose of describing particular embodiments only and is not intended to limit the present inventive concepts. As used herein, the singular forms are intended to include the plural forms as well. The terms 'comprises/includes' and/or 'comprising/including' used in the specification do not exclude the presence or addition of one or more other components.

Figure 2:
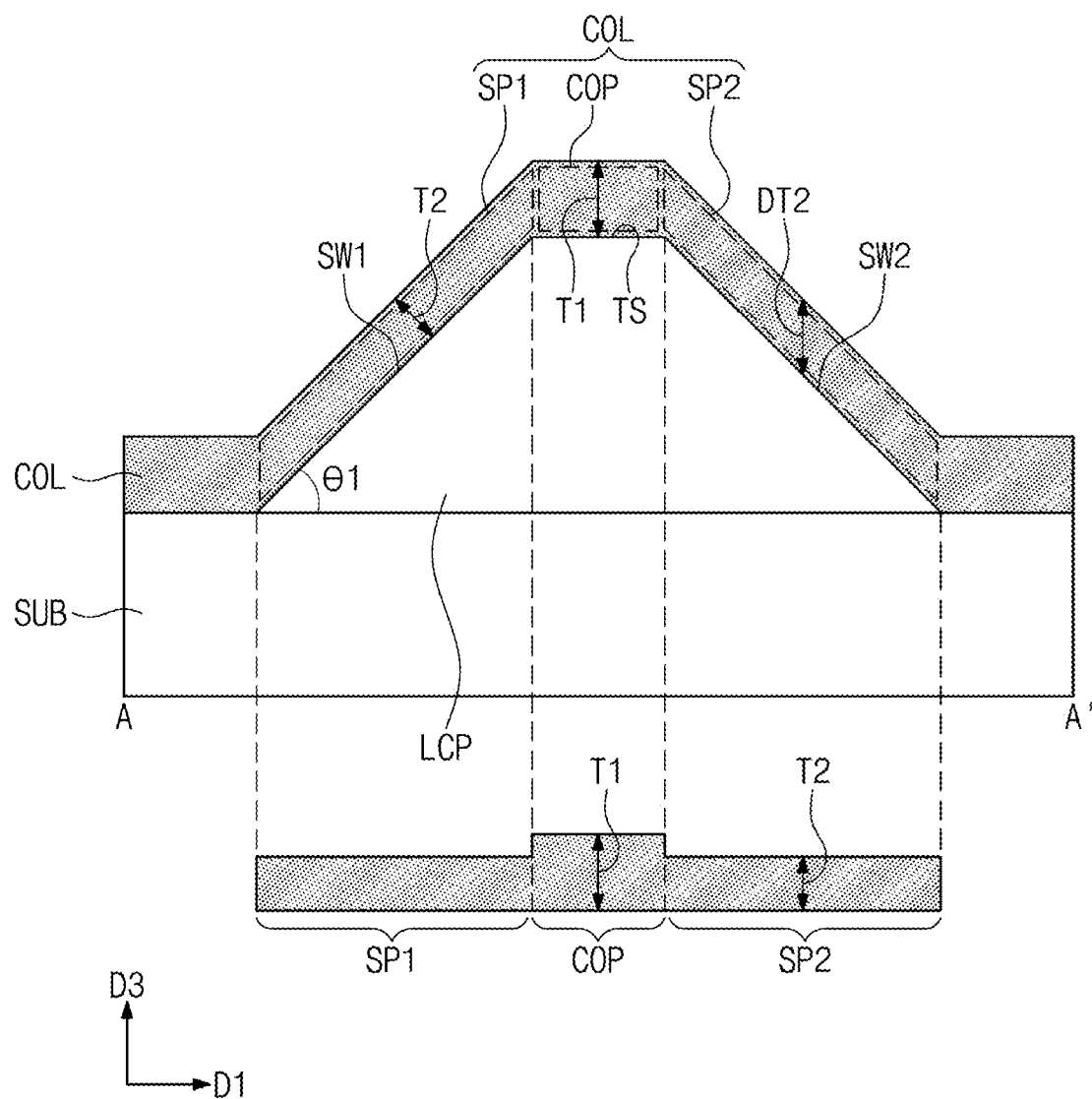
FIG. 2 illustrates a cross-sectional view taken along line A-A' of FIG. 1.

FIG. 1 illustrates a perspective view showing an optical device according to some example embodiments of the present inventive concepts. FIG. 2 illustrates a cross-sectional view taken along line A-A' of FIG. 1.

Referring to FIGS. 1 and 2, an optical device according to some embodiments of the present inventive concepts may include an optical waveguide WVG. The optical waveguide WVG may include a substrate SUB, a lower cladding pattern LCP, and a core layer COL. The substrate SUB may include a semiconductor substrate, such as a silicon substrate.

The lower cladding pattern LCP may be provided on the substrate SUB. The lower cladding pattern LCP may extend in a second direction D2. The lower cladding pattern LCP may have a trapezoidal or truncated pyramid-shaped cross-section along first and third directions D1 and D3 (see FIG. 2). The cross-section of the lower cladding pattern LCP may be perpendicular to the second direction D2. The lower cladding pattern LCP may have a width in the first direction D1 that decreases with increasing distance from the substrate SUB.

The lower cladding pattern LCP may have a first sidewall SW1, a second sidewall SW2, and a top surface TS. The top surface TS of the lower cladding pattern LCP may be parallel to a top surface of the substrate SUB. For example, the lower cladding pattern LCP may have a flat top surface TS. The lower cladding pattern LCP may have a bottom surface in contact with the top surface of the substrate SUB.

The first and second sidewalls SW1 and SW2 of the lower cladding pattern LCP may face each other. The first and second sidewalls SW1 and SW2 may be inclined. For example, a first angle θ1 of about 5° to 85° may be made between the first sidewall SW1 and the top surface of the substrate SUB. Preferably, the first angle θ1 may fall within a range from about 20° to about 60°. An angle made between the second sidewall SW2 and the top surface of the substrate SUB may be substantially the same as the first angle θ1. In this sense, the first and second sidewalls SW1 and SW2 may have their inclinations that are substantially the same as or similar to each other.

The first sidewall SW1, the second sidewall SW2, and the top surface TS of the lower cladding pattern LCP may each have a relatively low surface roughness. For example, the first sidewall SW1, the second sidewall SW2, and the top surface TS of the lower cladding pattern LCP may each have a surface roughness equal to or less than about 1 nm.

The lower cladding pattern LCP may include a dielectric material. For example, the lower cladding pattern LCP may include silicon oxide, silicon nitride, or silicon oxynitride. Preferably, the lower cladding pattern LCP may include silicon oxide having a relatively low refractive index (e.g., of about 1.45).

The core layer COL may be provided on the lower cladding pattern LCP. The core layer COL may cover the first sidewall SW1, the second sidewall SW2, and the top surface TS of the lower cladding pattern LCP. The core layer COL may cover the top surface of the substrate SUB exposed by the lower cladding pattern LCP.

The core layer COL may include a core part COP, a first side part SP1, and a second side part SP2. The core part COP may be provided on the top surface TS of the lower cladding pattern LCP. The first side part SP1 and the second side part SP2 may be respectively provided on the first sidewall SW1 and the second sidewall SW2 of the lower cladding pattern LCP. The core part COP, the first side part SP1, and the second side part SP2 may extend in the second direction D2 along the lower cladding pattern LCP. The core part COP may guide an incident light to travel in the second direction D2.

The core layer COL may be formed to have a deposition thickness DT2 that is uniform in the third direction D3 or a direction perpendicular to the top surface of the substrate SUB. For example, the deposition thickness DT2 in the third direction D3 of the core part COP may be substantially the same as a deposition thickness in the third direction D3 of the first side part SP1.

The core part COP may have a first thickness T1 in a direction perpendicular to the top surface TS of the lower cladding pattern LCP. The first thickness T1 may be the same as the deposition thickness DT2 of the core layer COL. The first side part SP1 may have a second thickness T2 in a direction perpendicular to the first sidewall SW1 of the lower cladding pattern LCP. The second side part SP2 may have the second thickness T2 in a direction perpendicular to the second sidewall SW2 of the lower cladding pattern LCP. The second thickness T2 may be different from the deposition thickness DT2 of the core layer COL. For example, the second thickness T2 may be less than the first thickness T1.

The second thickness T2 and the deposition thickness DT2 of the core layer COL may be different from each other due to the first angle θ1 made between the first sidewall SW1 and the top surface of the substrate SUB. For example, the second thickness T2 and the deposition thickness DT2 may have a relationship expressed by the following Mathematical Equation 1.

$$T2 = DT2 \times \cos\theta1 \quad \text{[Mathematical Equation 1]}$$

In addition, the second thickness T2 and the first thickness T1 may have a relationship expressed by the following Mathematical Equation 2.

$$T2 = T1 \times \cos\theta1 \quad \text{[Mathematical Equation 2]}$$

Referring back to FIG. 2, the core layer COL according to some embodiments of the present inventive concepts may be similar to a ridge structure that includes the core part COP having the first thickness T1 and the first and second side parts SP1 and SP2 each having the second thickness T2 less than the first thickness T1.

The core layer COL may include a material whose refractive index is greater than that of the lower cladding pattern LCP. In some embodiments, the core layer COL may include a chalcogenide compound, for example, chalcogenide glass. The chalcogenide glass may include a chalcogen element selected from S, Se, and Te and at least one element (e.g., post-transition metal element or metalloid element) selected from Ga, Ge, As, In, Sn, Sb, and Bi. For example, the core layer COL may include a chalcogenide glass of As—S, Ge—Se, In—Se, Sb—Se, Sb—Te, In—Sb—Se, In—Sb—Te, Ge—Sb—Se, or Ge—Sb—Te—Se.

In other embodiments, the core layer COL may include a silicon-containing dielectric material whose refractive index is greater than that of the lower cladding pattern LCP. For example, when the lower cladding pattern LCP includes silicon oxide, the core layer COL may include silicon nitride or silicon oxynitride.

An upper cladding layer may be provided on the core layer COL. The upper cladding layer may cover the core layer COL. For example, the core layer COL may be interposed between the lower cladding pattern LCP and the upper cladding layer. The upper cladding layer may be air. Alternatively, the upper cladding layer may include silicon oxide, silicon nitride, or silicon oxynitride.

Figure 3:
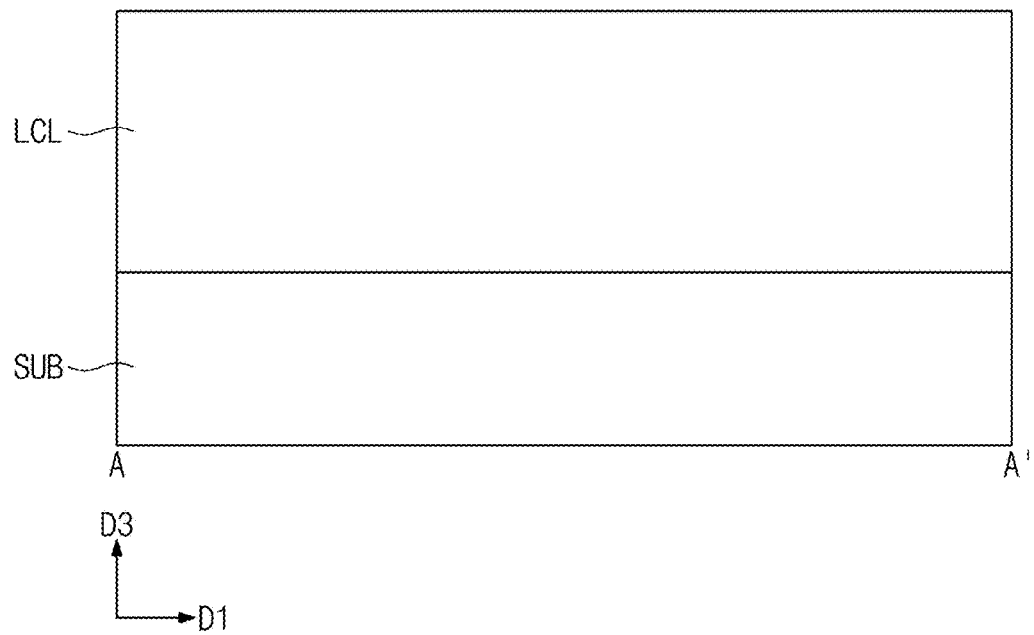
FIGS. 3, 4, and 5 illustrate cross-sectional views taken along line A-A' of FIG. 1, showing a method of fabricating an optical device according to some example embodiments of the present inventive concepts.
Figure 4:
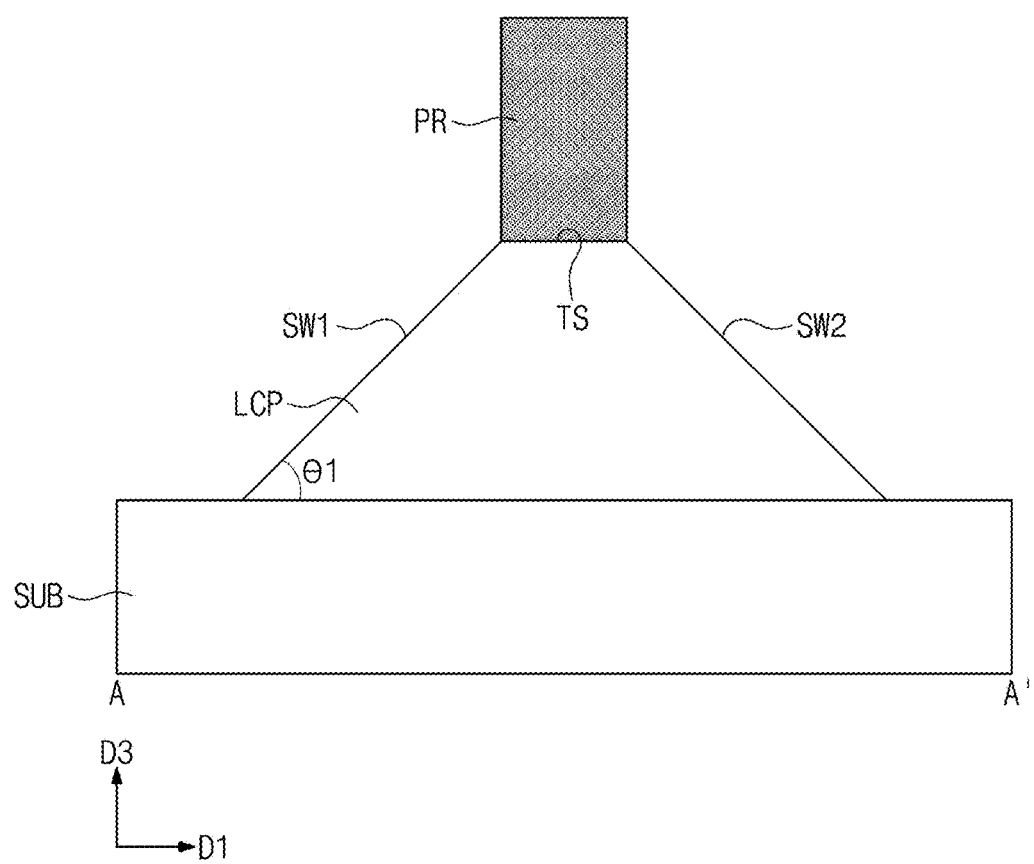
Figure 5:
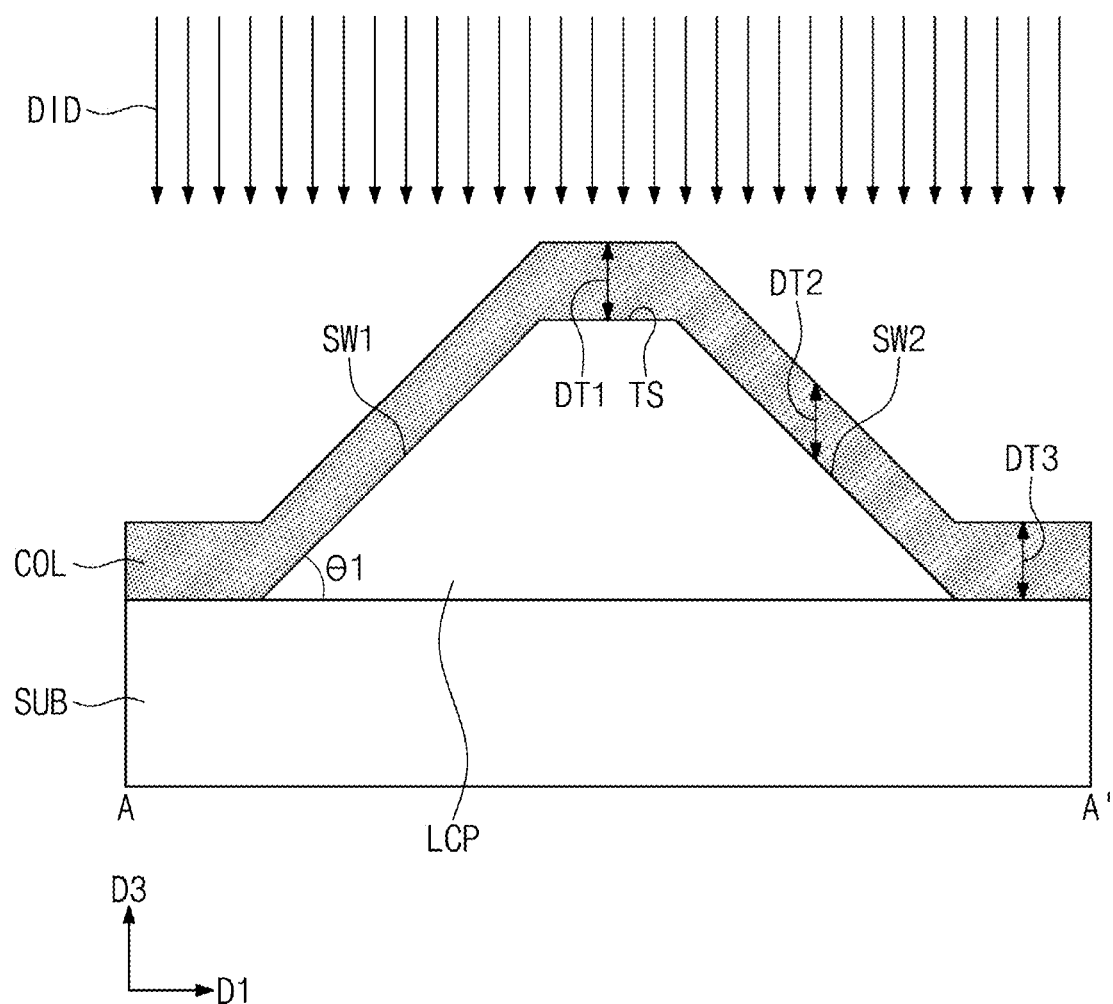

FIGS. 3, 4, and 5 illustrate cross-sectional views taken along line A-A' of FIG. 1, showing a method of fabricating an optical device according to some example embodiments of the present inventive concepts.

Referring to FIGS. 1 and 3, a lower cladding layer LCL may be formed on a substrate SUB. The lower cladding layer LCL may be formed by using thermal oxidation, atomic layer deposition (ALD), chemical vapor deposition (CVD), or physical vapor deposition (PVD). The lower cladding layer LCL may include a dielectric material, for example, silicon oxide, silicon nitride, or silicon oxynitride.

Referring to FIGS. 1 and 4, a photoresist pattern PR may be formed on the lower cladding layer LCL. The photoresist pattern PR may have a linear shape that extends in a second direction D2. For example, the formation of the photoresist pattern PR may include forming a photoresist layer on the lower cladding layer LCL, and then exposing and developing the photoresist layer.

The photoresist pattern PR may be used as an etching mask to pattern the lower cladding layer LCL to form a lower cladding pattern LCP. The patterning of the lower cladding layer LCL may continue until a top surface of the substrate SUB is partially exposed.

The patterning process may be performed to cause the lower cladding pattern LCP to have an inclined first sidewall SW1 and an inclined second sidewall SW2. For example, an etching recipe and condition of the patterning process may be controlled to form the inclined first and second sidewalls SW1 and SW2. The patterning process may make a first angle $\theta1$ of about 5° to 85° between the first sidewall SW1 and the top surface of the substrate SUB.

A top surface TS of the lower cladding pattern LCP may be defined below the photoresist pattern PR. Because the photoresist pattern PR protects the top surface TS of the lower cladding pattern LCP, the top surface TS of the lower cladding pattern LCP may be parallel to the top surface of the substrate SUB.

The patterning process may be performed on a dielectric material, such as silicon oxide, silicon nitride, or silicon oxynitride, which are commonly used for semiconductor etching processes, and thus the lower cladding pattern LCP may be easily formed to have a relatively low surface roughness. For example, the first sidewall SW1, the second sidewall SW2, and the top surface TS of the lower cladding pattern LCP may be formed to each have a surface roughness equal to or less than about 1 nm.

Referring to FIGS. 1 and 5, a core layer COL may be formed on the lower cladding pattern LCP. A direction deposition process DID may be employed to form the core layer COL. The directional deposition process DID may deposit a material to have a deposition thickness that is vertically uniform. For example, the directional deposition process DID may include physical vapor deposition (PVD), such as sputtering or evaporation.

The core layer COL may have a first deposition thickness DT1 in a third direction D3 on the top surface TS of the lower cladding pattern LCP. The core layer COL may have a second deposition thickness DT2 in the third direction D3 on the first and second sidewalls SW1 and SW2 of the lower cladding pattern LCP. The core layer COL may have a third deposition thickness DT3 in the third direction D3 on the top surface of the substrate SUB. The first, second, and third deposition thicknesses DT1, DT2, and DT3 may be substantially the same as each other. For example, a deposition thickness in the third direction D3 of the core layer COL may be constant regardless of whether a surface for deposition is flat or inclined.

The core layer COL may include a chalcogenide glass or a silicon-containing dielectric material. For example, the core layer COL may be formed by a sputtering process that uses a target including a chalcogen element selected from S, Se, and Te and at least one element selected from Ga, Ge, As, In, Sn, Sb, and Bi.

Subsequently, an upper cladding layer may be formed on the core layer COL. For example, the upper cladding layer may be air. For another example, the upper cladding layer may include silicon oxide, silicon nitride, or silicon oxynitride.

In general, to achieve a ridge-structured core layer of an optical waveguide, it is typically required that an etching process be separately performed after the formation of the core layer. A surface roughness of the core layer may be inevitably deteriorated while the core layer is etched, which may result in a reduction in optical characteristics of an optical device. In contrast, according to some embodiments of the present inventive concepts, the core layer COL may be formed to have the ridge structure discussed above with reference to FIG. 2 by using only a deposition process without separately performing an etching process. Consequently, the core layer COL according to some embodiments of the present inventive concepts may have an improved surface roughness, and thus an optical device of the present inventive concepts may have excellent optical characteristics.

Figure 6:
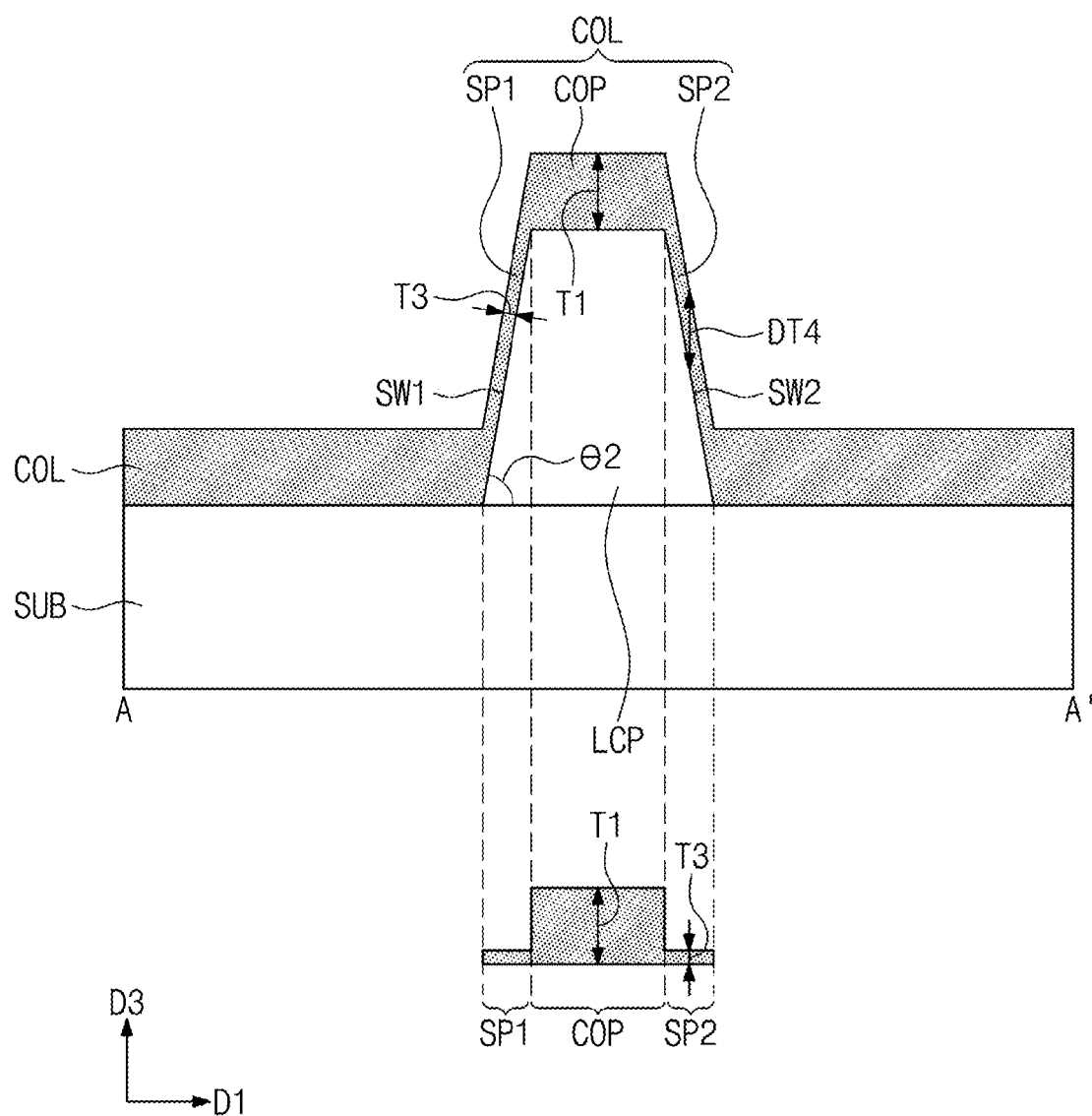
FIGS. 6 and 7 illustrate cross-sectional views taken along line A-A' of FIG. 1, showing an optical device according to some example embodiments of the present inventive concepts.
Figure 7:
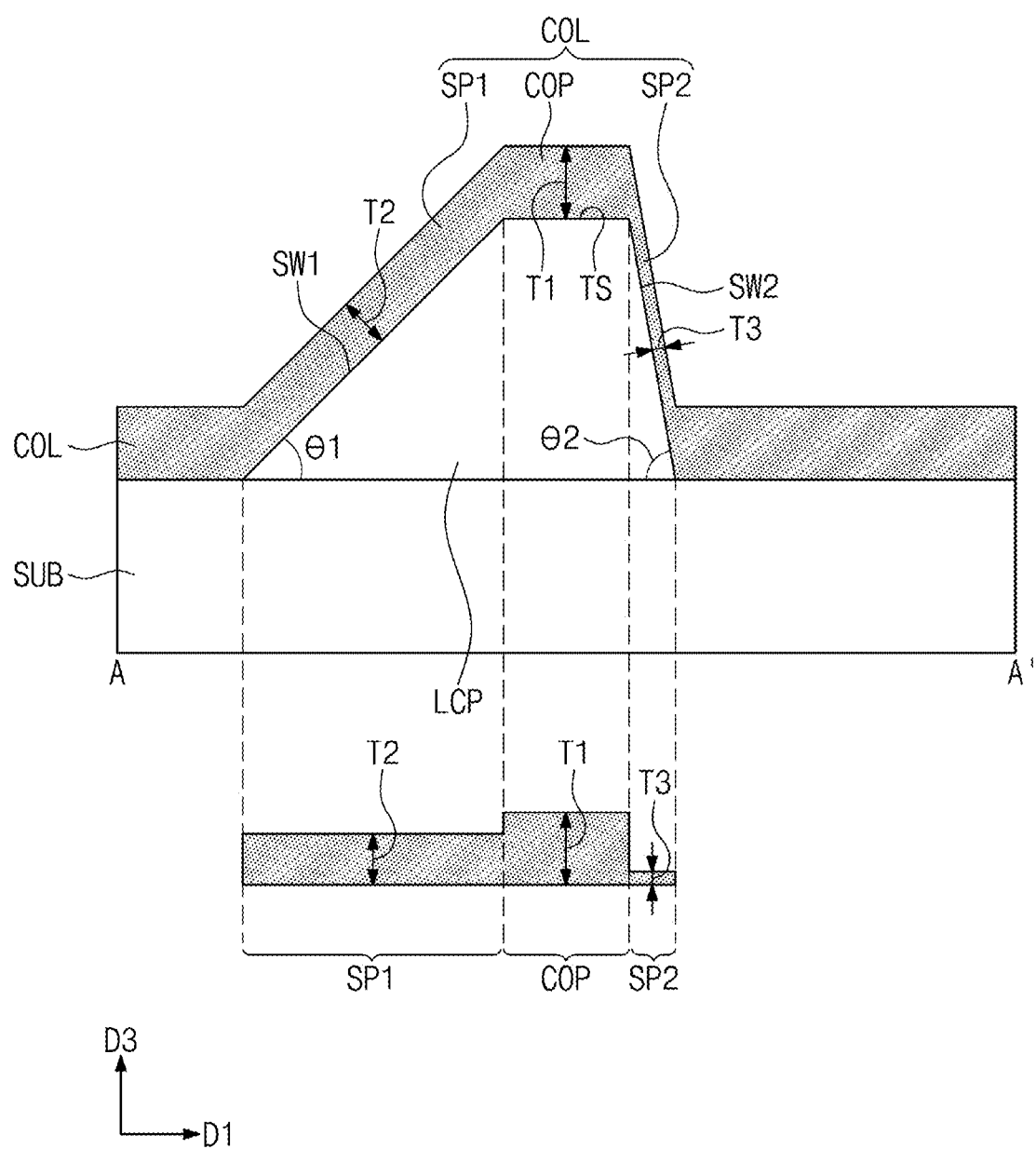

FIGS. 6 and 7 illustrate cross-sectional views taken along line A-A' of FIG. 1, showing an optical device according to some example embodiments of the present inventive concepts. In the embodiment that follows, omission will be made to avoid repetitive detailed descriptions about technical features of the optical device discussed above with reference to FIGS. 1 and 2, and a difference thereof will be discussed in detail.

Referring to FIGS. 1 and 6, a second angle $\theta2$ may be made between the first sidewall SW1 of the lower cladding pattern LCP and the top surface of the substrate SUB. An angle made between the second sidewall SW2 and the top surface of the substrate SUB may be substantially the same as the second angle $\theta2$. The second angle $\theta2$ may be greater than the first angle $\theta1$ discussed above with reference to FIGS. 1 and 2. For example, the first and second sidewalls SW1 and SW2 according to the present embodiment may be steeper than the first and second sidewalls SW1 and SW2 discussed above with reference to FIGS. 1 and 2.

The first and second side parts SP1 and SP2 on the first and second sidewalls SW1 and SW2 may each have a deposition thickness DT4 in the third direction D3 substantially the same as the deposition thickness DT2 of the core layer COL discussed above with reference to FIGS. 1 and 2.

The first side part SP1 may have a third thickness T3 in a direction perpendicular to the first sidewall SW1 of the lower cladding pattern LCP. The second side part SP2 may have the third thickness T3 in a direction perpendicular to the second sidewall SW2 of the lower cladding pattern LCP. Because the second angle $\theta2$ is greater than the first angle $\theta1$, the third thickness T3 may be less than the second thickness T2 discussed above with reference to FIGS. 1 and 2 (i.e., T3=DT4×cos $\theta2$).

The core layer COL according to the present embodiment may be similar to a ridge structure that includes the core part COP having the first thickness T1 and the first and second side parts SP1 and SP2 each having the third thickness T3 less than the first thickness T1.

According to some embodiments of the present inventive concepts, inclinations of the first and second sidewalls SW1 and SW2 of the lower cladding pattern LCP may be controlled to adjust thicknesses of the first and second side parts SP1 and SP2 and a width in the first direction D1 of the core layer COL. For example, inclinations of the first and second sidewalls SW1 and SW2 of the lower cladding pattern LCP may be adjusted to achieve various types of ridge structure.

Referring to FIGS. 1 and 7, a first angle $\theta1$ may be made between the first sidewall SW1 of the lower cladding pattern LCP and the top surface of the substrate SUB. A second angle $\theta2$ may be made between the second sidewall SW2 of the lower cladding pattern LCP and the top surface of the substrate SUB. The first and second angles $\theta1$ and $\theta2$ may be different from each other. For example, the second angle $\theta2$ may be greater than the first angle $\theta1$. In this configuration, the second sidewall SW2 may be steeper than the first sidewall SW1.

The first side part SP1 may have a second thickness T2 in a direction perpendicular to the first sidewall SW1 of the lower cladding pattern LCP. The second side part SP2 may have a third thickness T3 in a direction perpendicular to the second sidewall SW2 of the lower cladding pattern LCP. Because the second angle $\theta2$ is greater than the first angle $\theta1$, the third thickness T3 of the second side part SP2 may be less than the second thickness T2 of the first side part SP1.

The core layer COL according to the present embodiment may be similar to a ridge structure that includes the core part COP having the first thickness T1, the first side part SP1 having the second thickness T2, and the second side part SP2 having the third thickness T3. According to some embodiments of the present inventive concepts, the core layer COL may be shaped such that inclinations of the first and second sidewalls SW1 and SW2 of the lower cladding pattern LCP are adjusted independently of each other to achieve various types of ridge structure.

FIGS. 8, 9, 10, and 11 illustrate cross-sectional views taken along line A-A' of FIG. 1, showing an optical device according to some example embodiments of the present inventive concepts. In the embodiment that follows, omission will be made to avoid repetitive detailed descriptions about technical features of the optical device discussed above with reference to FIGS. 1 and 2, and a difference thereof will be discussed in detail.

Figure 8:
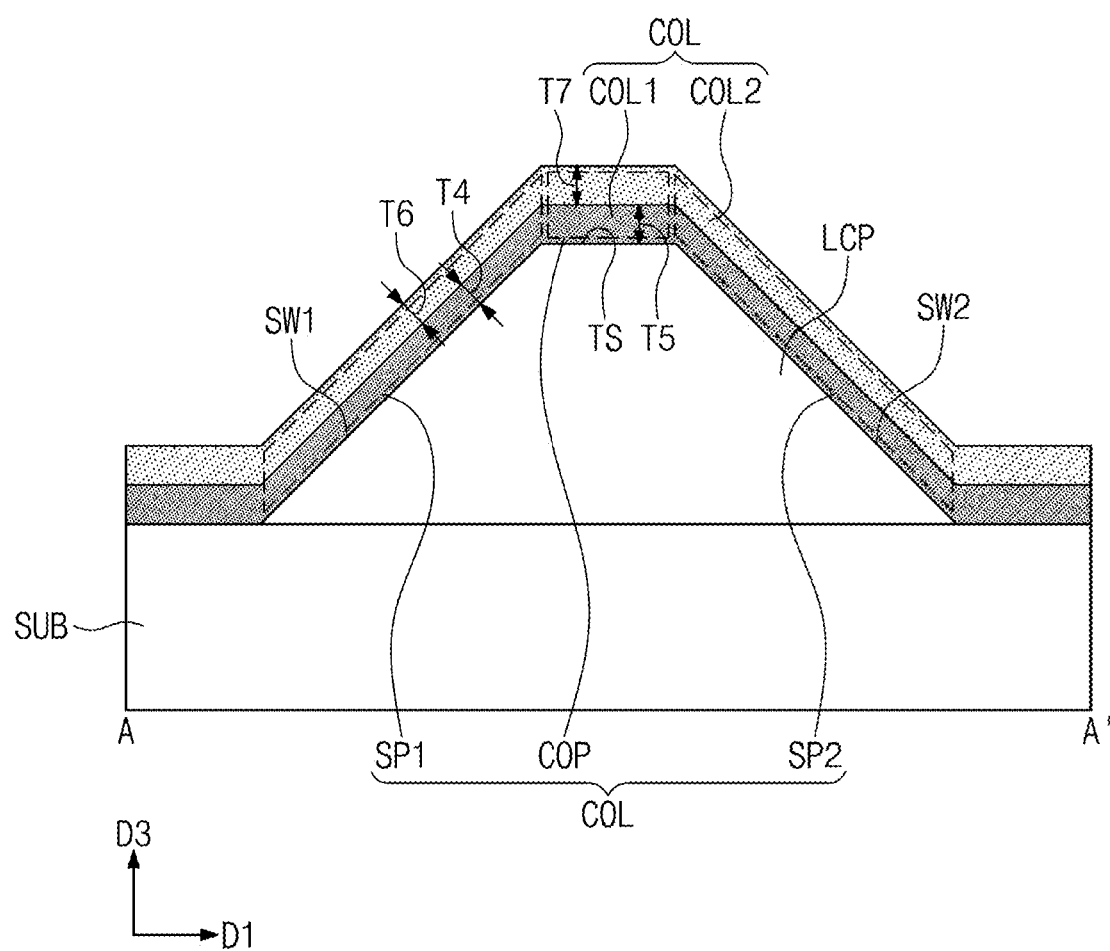
FIGS. 8, 9, 10, and 11 illustrate cross-sectional views taken along line A-A' of FIG. 1, showing an optical device according to some example embodiments of the present inventive concepts.

Referring to FIGS. 1 and 8, the core layer COL may include a first core layer COL1 on the lower cladding pattern LCP and a second core layer COL2 on the first core layer COL1. For example, the core layer COL may have a multi-layered structure.

The first and second core layers COL1 and COL2 may include their materials whose refractive indices are different from each other. In some embodiments, one of the first and second core layers COL1 and COL2 may include a chalcogenide glass, and the other of the first and second core layers COL1 and COL2 may include a silicon-containing dielectric material. In other embodiments, one of the first and second core layers COL1 and COL2 may include a first chalcogenide glass, and the other of the first and second core layers COL1 and COL2 may include a second chalcogenide glass different from the first chalcogenide glass.

As discussed above with reference to FIG. 5, a directional deposition process may be used to form the first and second core layers COL1 and COL2. For example, the formation of the core layer COL according to the present embodiment may include depositing the first core layer COL1 on the lower cladding pattern LCP, and depositing the second core layer COL2 on the first core layer COL1. Although not shown, at least one core layer may further be formed on the second core layer COL2.

The first core layer COL1 of the first side part SP1 may have a fourth thickness T4 in a direction perpendicular to the first sidewall SW1. The first core layer COL1 of the core part COP may have a fifth thickness T5 in a direction perpendicular to the top surface TS of the lower cladding pattern LCP. The fifth thickness T5 may be greater than the fourth thickness T4. The second core layer COL2 of the first side part SP1 may have a sixth thickness T6 in the direction perpendicular to the first sidewall SW1. The second core layer COL2 of the core part COP may have a seventh thickness T7 in the direction perpendicular to the top surface TS. The seventh thickness T7 may be greater than the sixth thickness T6. The fifth and seventh thicknesses T5 and T7 may be substantially the same as or different from each other.

According to a comparative example of the present inventive concepts, when the first and second core layers COL1 and COL2 are conformally deposited, and when an etching process is selectively performed on the first and second side parts SP1 and SP2, the first and second side parts SP1 and SP2 may decrease in thickness. In this case, the sixth thickness T6 of the second core layer COL2 may be less than the seventh thickness T7, but there may occur an issue that the fourth thickness T4 of the first core layer COL1 remains substantially the same as the fifth thickness T5.

In contrast, according to the present embodiment, a directional deposition process may be sued to form each of the first and second core layers COL1 and COL2. As a result, even when no etching process is separately performed, the fifth thickness T5 may be greater than the fourth thickness T4, and the seventh thickness T7 may be greater than the sixth thickness T6.

According the present embodiment, the core layer COL may be formed to have a multi-layered ridge structure by using only a deposition process without separately performing an etching process. Because the first and second core layers COL1 and COL2 are formed by using only a deposition process without separately performing an etching process, the formation of the first and second core layers COL1 and COL2 may be easily achieved with no consideration of etching characteristics between the first and second core layers COL1 and COL2.

Figure 9:
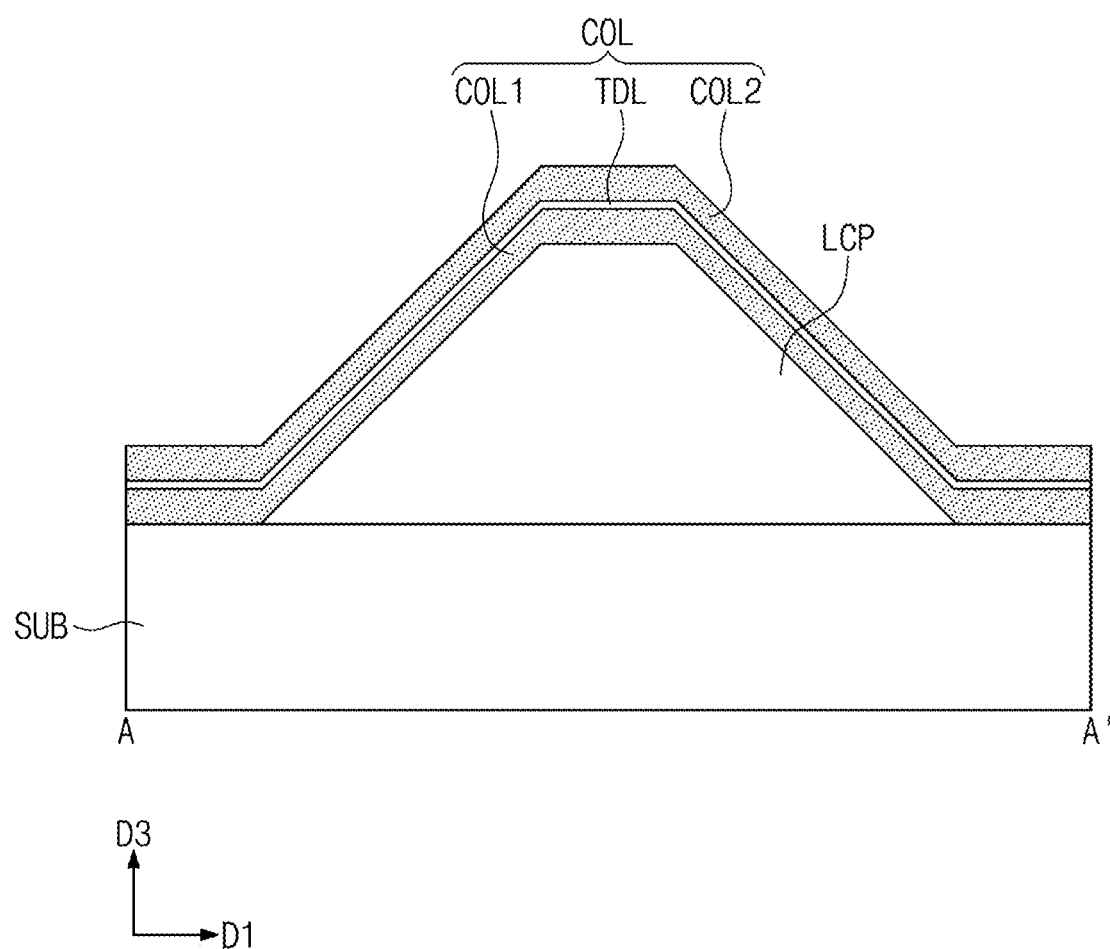

Referring to FIGS. 1 and 9, the core layer COL may include a first core layer COL1 on the lower cladding pattern LCP, a second core layer COL2 on the first core layer COL1, and a two-dimensional material layer TDL between the first and second core layers COL1 and COL2. For example, the core layer COL may have a multi-layered structure.

In some embodiments, the first and second core layers COL1 and COL2 may include the same material as each other. For example, the first core layer COL1 may include a first chalcogenide glass, and the second core layer COL2 may include the same first chalcogenide glass as that of the first core layer COL1.

In other embodiments, the first and second core layers COL1 and COL2 may include their materials whose refractive indices are different from each other. For example, the first core layer COL1 may include a first chalcogenide glass, and the second core layer COL2 may include a second chalcogenide glass different from the first chalcogenide glass.

The two-dimensional material layer TDL may include either a material made of one two-dimensional layer or a material made of N stacked two-dimensional layers. The symbol N may be an integer from 2 to 10. For example, the two-dimensional material layer TDL may have a monolayered structure, a bilayered structure, or trilayered structure. The two-dimensional material layer TDL may have a thickness less than that of each of the first and second core layers COL1 and COL2.

For example, the two-dimensional material layer TDL may include a two-dimensional chalcogenide compound. For another example, the two-dimensional material layer TDL may include a two-dimensional carbon compound (e.g., graphene).

As discussed above with reference to FIG. 5, a directional deposition process may be used to form the first and second core layers COL1 and COL2. The two-dimensional material layer TDL may be conformally formed by using atomic layer deposition (ALD) or chemical vapor deposition (CVD). For example, the formation of the core layer COL according to the present embodiment may include depositing the first core layer COL1 on the lower cladding pattern LCP, forming the two-dimensional material layer TDL on the first core layer COL1, and depositing the second core layer COL2 on the two-dimensional material layer TDL. Although not shown, at least one core layer may further be formed on the second core layer COL2.

The core layer COL according to the present embodiment may be formed to have a multi-layered ridge structure by using only a deposition process without separately performing an etching process. According to some embodiments of the present inventive concepts, because the core layer COL is provided on its center with the two-dimensional material layer TDL that can interact strongly with light, an optical device may increase in optical characteristics.

Figure 10:
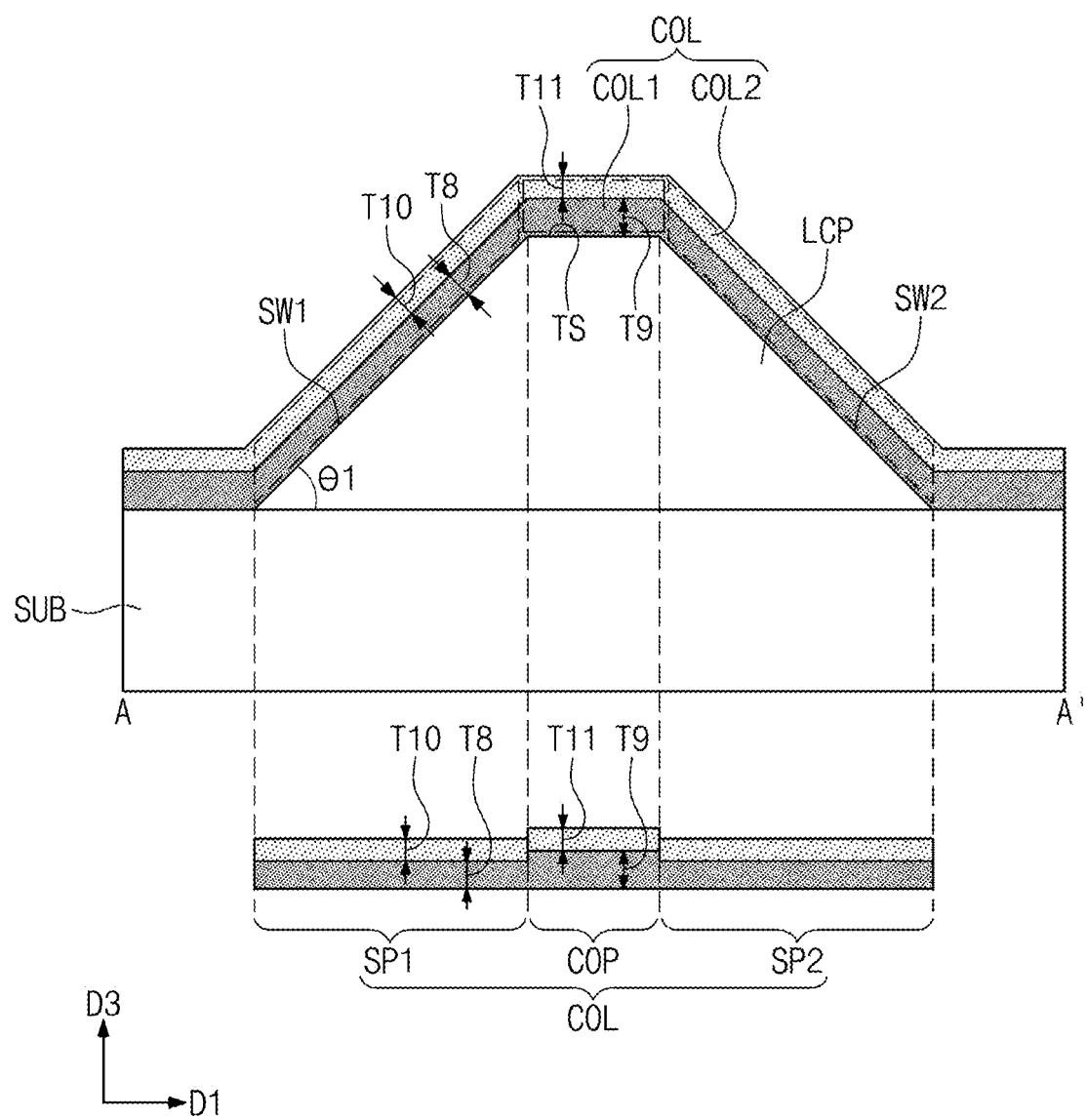

Referring to FIGS. 1 and 10, the core layer COL may have a multi-layered structure that includes a first core layer COL1 and a second core layer COL2. The first and second core layers COL1 and COL2 may include their materials whose refractive indices are different from each other, and a detailed description thereof may be the same as that discussed above with reference to FIG. 8. Additionally, the second core layer COL2 may include a material whose refractive index is less than that of silicon oxide.

As discussed above with reference to FIG. 5, a directional deposition process may be used to form the first core layer COL1. Unlike the first core layer COL1, the second core layer COL2 may be formed by using a conformal deposition process. For example, the formation of the core layer COL according to the present embodiment may include depositing the first core layer COL1 on the lower cladding pattern LCP, and depositing the second core layer COL2 on the first core layer COL1. The first core layer COL1 may be deposited by using physical vapor deposition (PVD), such as sputtering. The second core layer COL2 may be conformally formed by using atomic layer deposition (ALD) or chemical vapor deposition (CVD).

The first core layer COL1 of the first side part SP1 may have an eighth thickness T8 in a direction perpendicular to the first sidewall SW1. The first core layer COL1 of the core part COP may have a ninth thickness T9 in a direction perpendicular to the top surface TS. The ninth thickness T9 may be greater than the eighth thickness T8.

The second core layer COL2 of the first side part SP1 may have a tenth thickness T10 in the direction perpendicular to the first sidewall SW1. The second core layer COL2 of the core part COP may have an eleventh thickness T11 in the direction perpendicular to the top surface TS. The eleventh thickness T11 may be substantially the same as the tenth thickness T10.

The core part COP of the core layer COL may have a thickness the same as a sum of the ninth thickness T9 and the eleventh thickness T11. The first side part SP1 of the core layer COL may have a thickness the same as a sum of the eighth thickness T8 and the tenth thickness T10. Because it is estimated that T8 equals to T9×cos θ1 and T10 equals to T11, the thickness of the first side part SP1 of the core layer COL may be expressed by the following relation T9×cos θ1+T11.

Because the multi-layered core layer COL according to the present embodiment includes at least one core layer (e.g., the first core layer COL1) formed by using a directional deposition process, the core layer COL may have a ridge structure even when other core layers are conformally formed.

Figure 11:
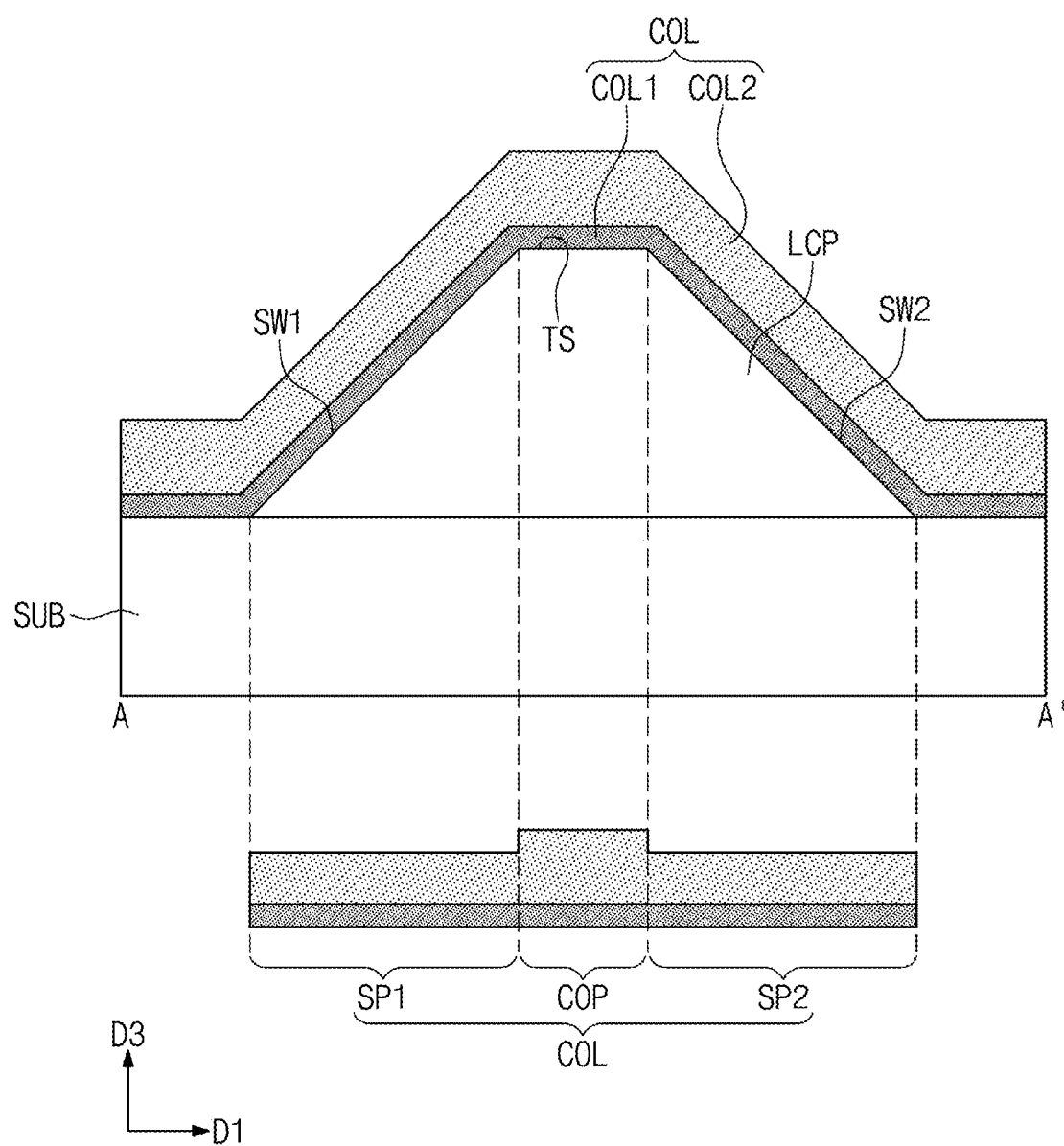

Referring to FIGS. 1 and 11, similar to that discussed above with reference to FIG. 10, the core layer COL may have a multi-layered structure that includes a first core layer COL1 and a second core layer COL2. The first core layer COL1 may be formed by using a conformal deposition process, and the second core layer COL2 may be formed by using a directional deposition process. For example, the first core layer COL1 on the first sidewall SW1 may have a thickness substantially the same as that of the first core layer COL1 on the top surface TS. The second core layer COL2 on the first sidewall SW1 may have a thickness less than that of the second core layer COL2 on the top surface TS.

Because the multi-layered core layer COL according to the present embodiment includes at least one core layer (e.g., the second core layer COL2) formed by using a directional deposition process, the core layer COL may have a ridge structure even when other core layers are conformally formed.

Figure 12:
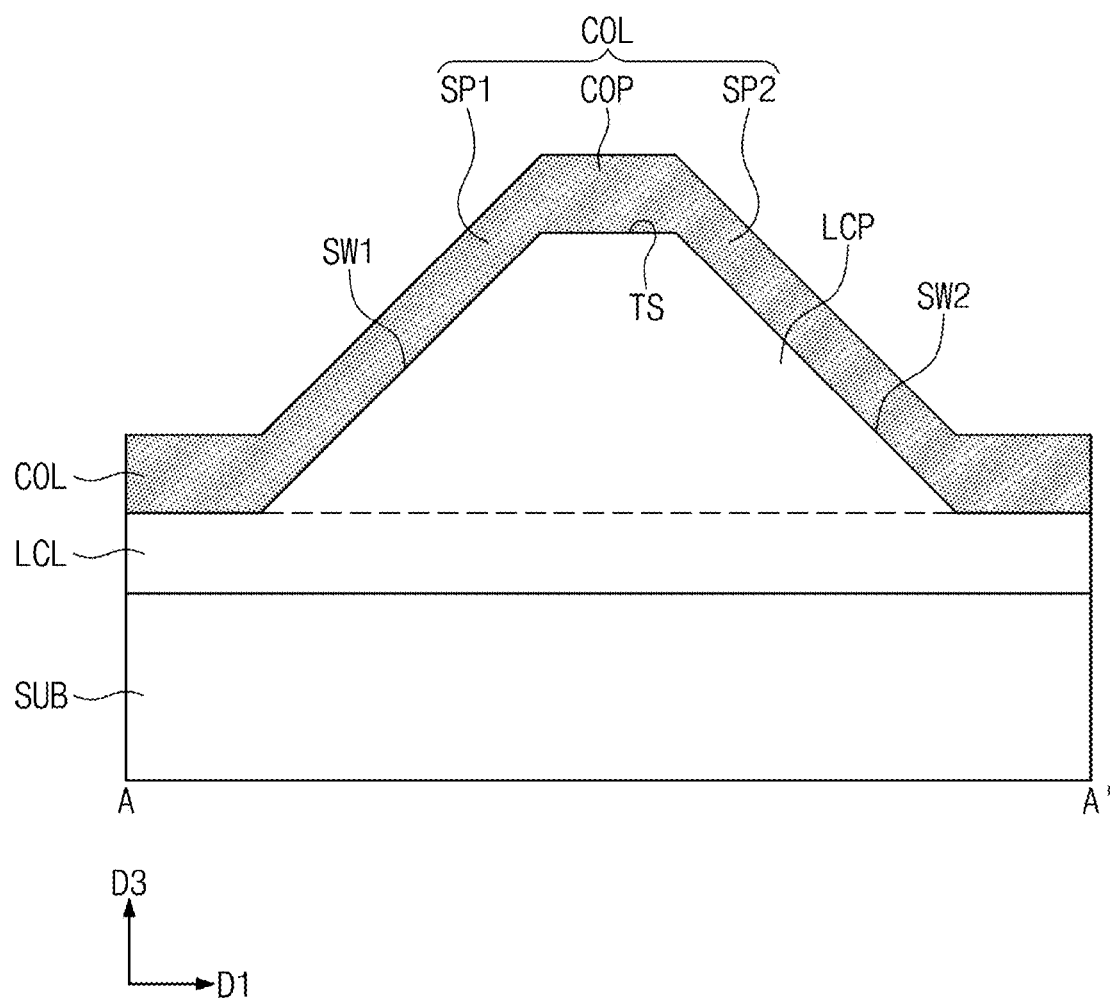
FIGS. 12 and 13 illustrate cross-sectional views taken along line A-A' of FIG. 1, showing an optical device according to some example embodiments of the present inventive concepts.
Figure 13:
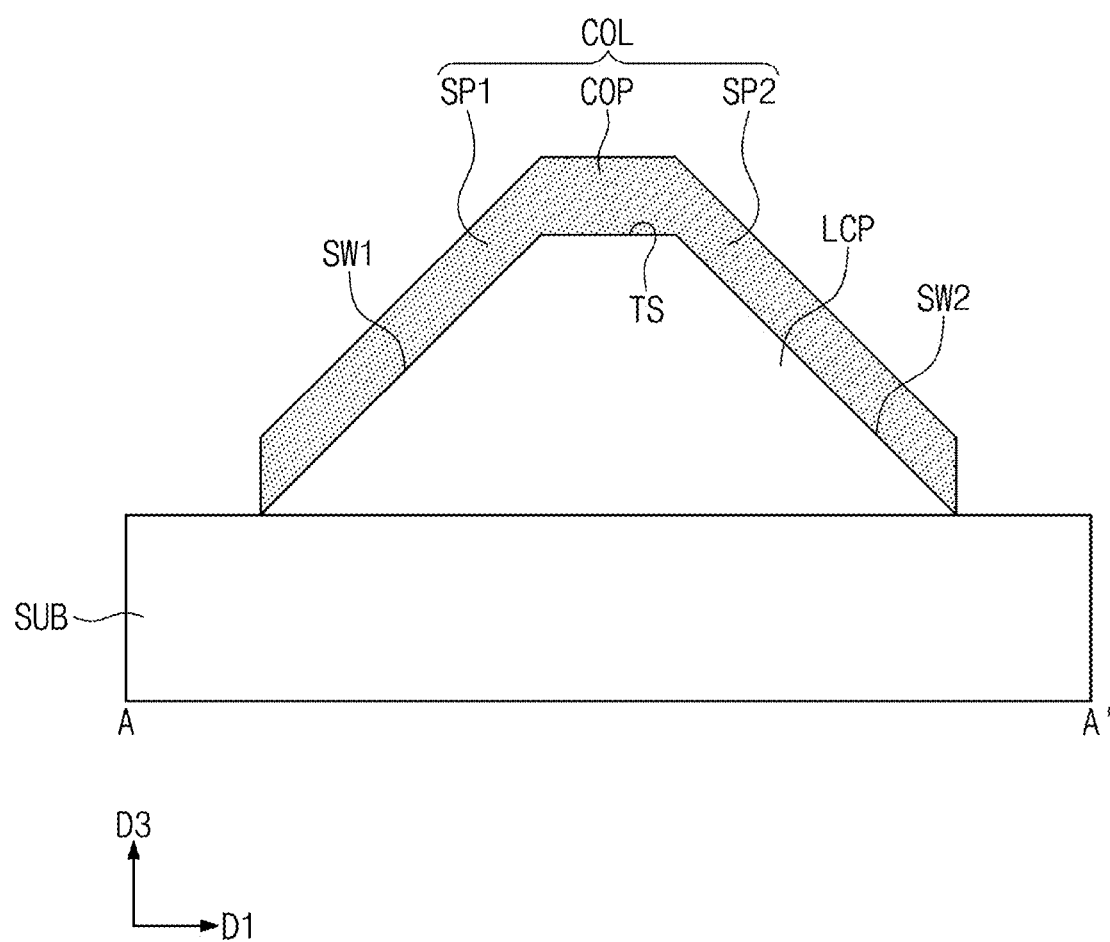

FIGS. 12 and 13 illustrate cross-sectional views taken along line A-A' of FIG. 1, showing an optical device according to some example embodiments of the present inventive concepts. In the embodiment that follows, omission will be made to avoid repetitive detailed descriptions about technical features of the optical device discussed above with reference to FIGS. 1 and 2, and a difference thereof will be discussed in detail.

Referring to FIGS. 1 and 12, the lower cladding layer LCL may be provided on the substrate SUB. The top surface of the substrate SUB may be covered with the lower cladding layer LCL. The lower cladding layer LCL may include the lower cladding pattern LCP at an upper portion thereof. The core layer COL may be provided on the lower cladding layer LCL.

Referring to FIGS. 1 and 13, the core layer COL may not cover the top surface of the substrate SUB exposed by the lower cladding pattern LCP. For example, the core layer COL may be partially removed at its portion that covers the top surface of the substrate SUB.

Figure 14:
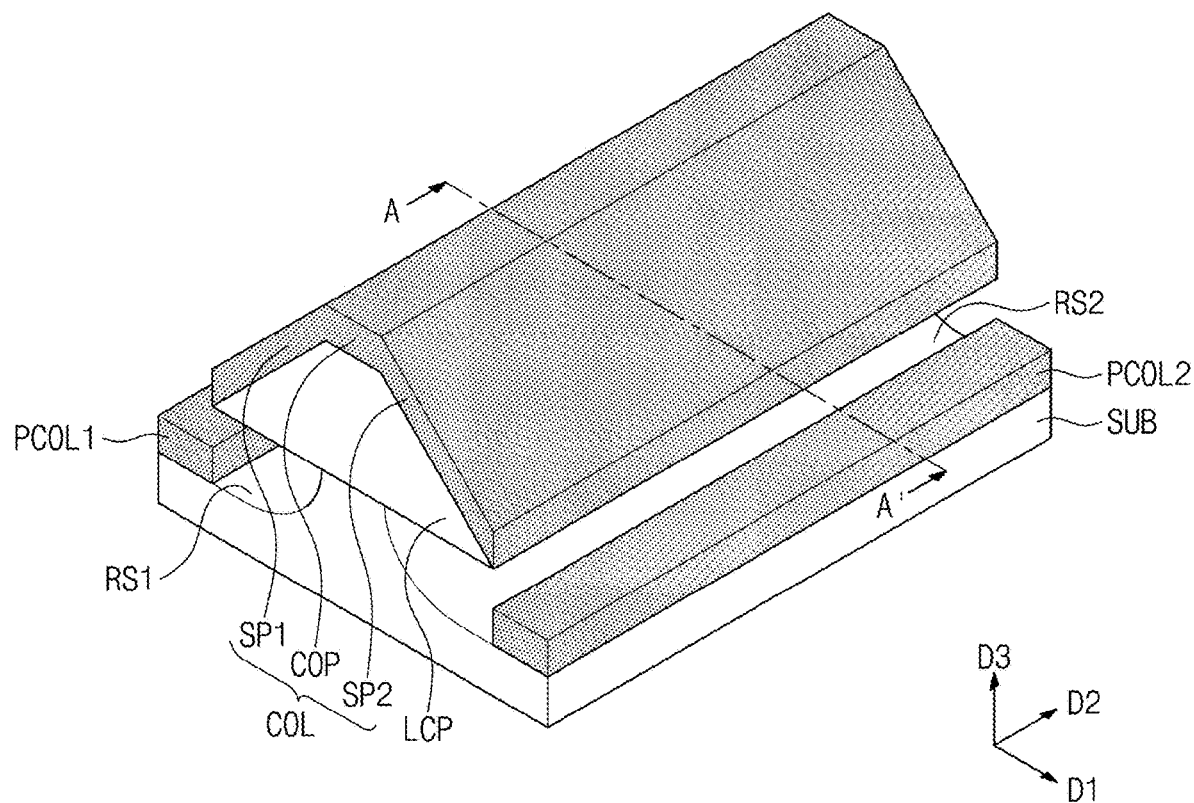
FIGS. 14 and 16 illustrate perspective views showing an optical device according to some example embodiments of the present inventive concepts.
Figure 15:
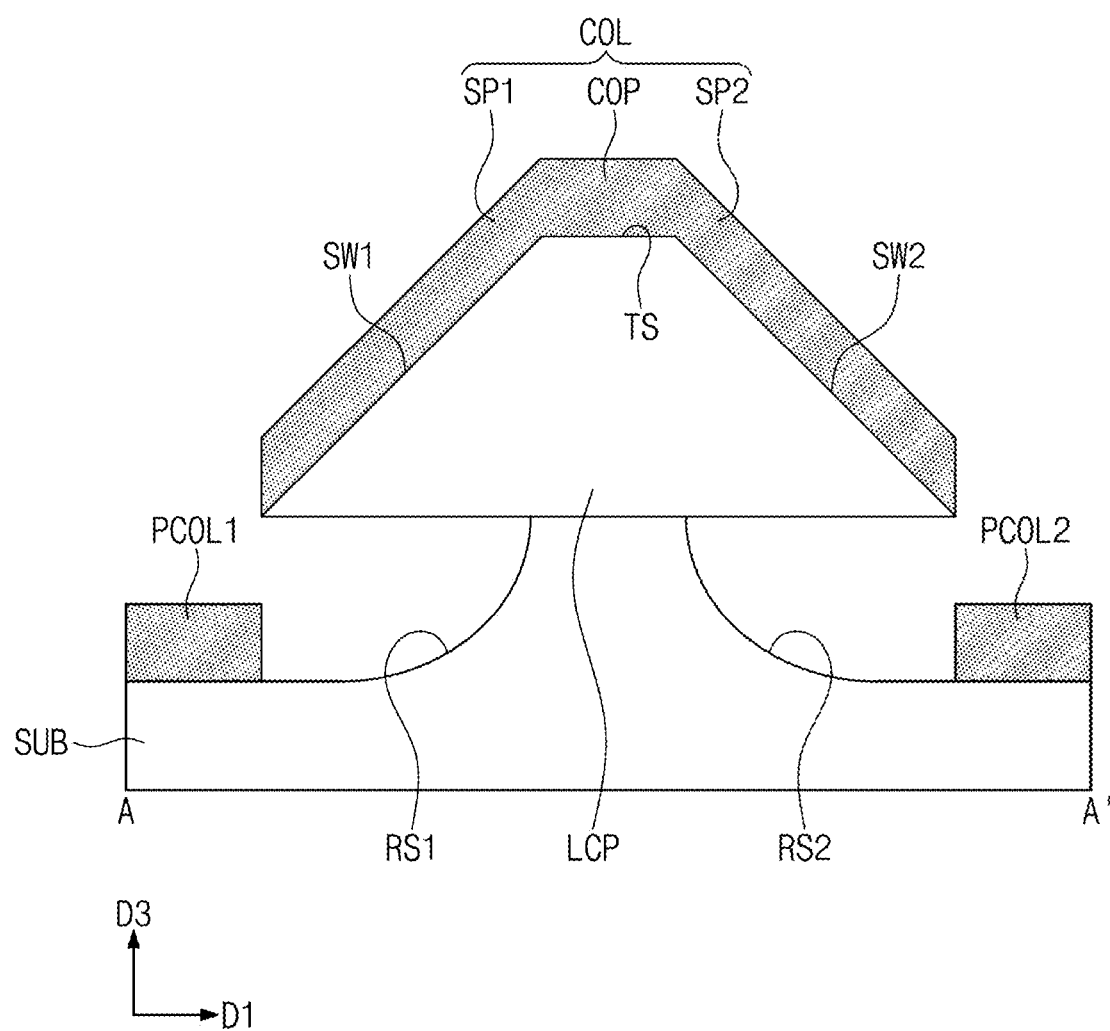
FIGS. 15 and 17 illustrate cross-sectional views taken along line A-A' of FIGS. 14 and 16, respectively.
Figure 16:
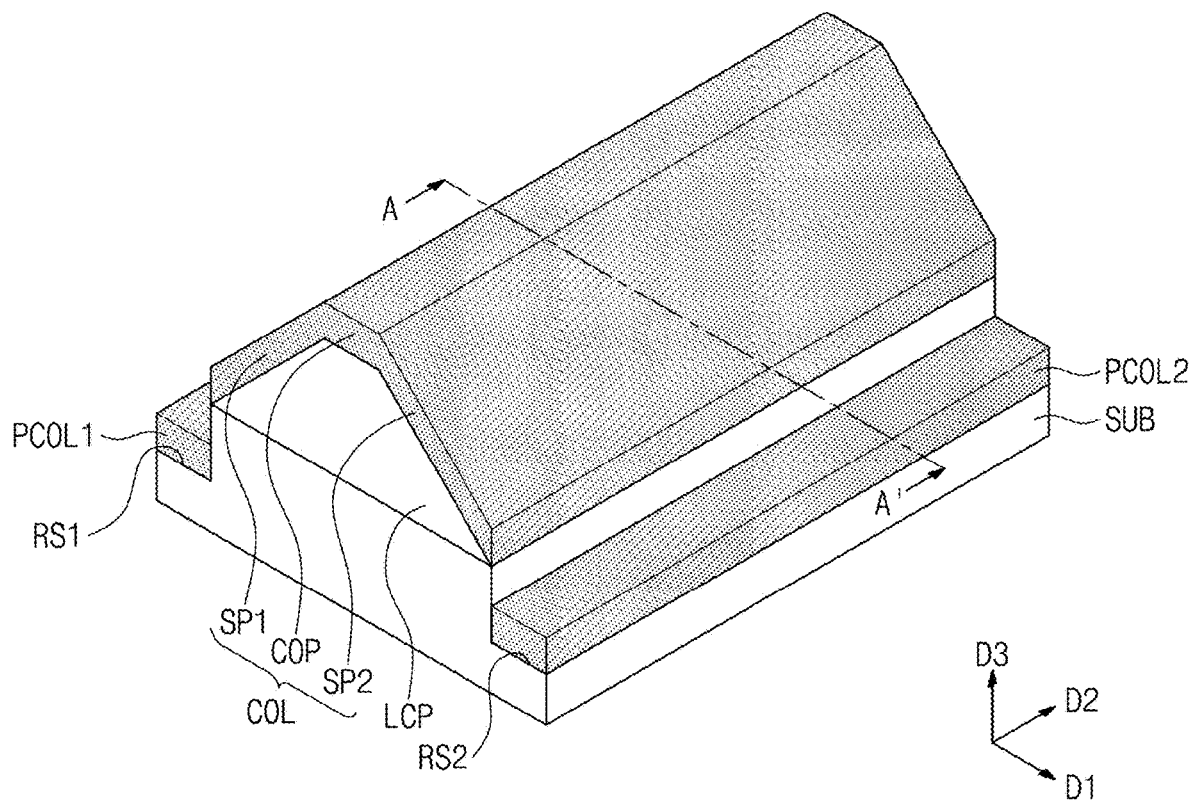
Figure 17:
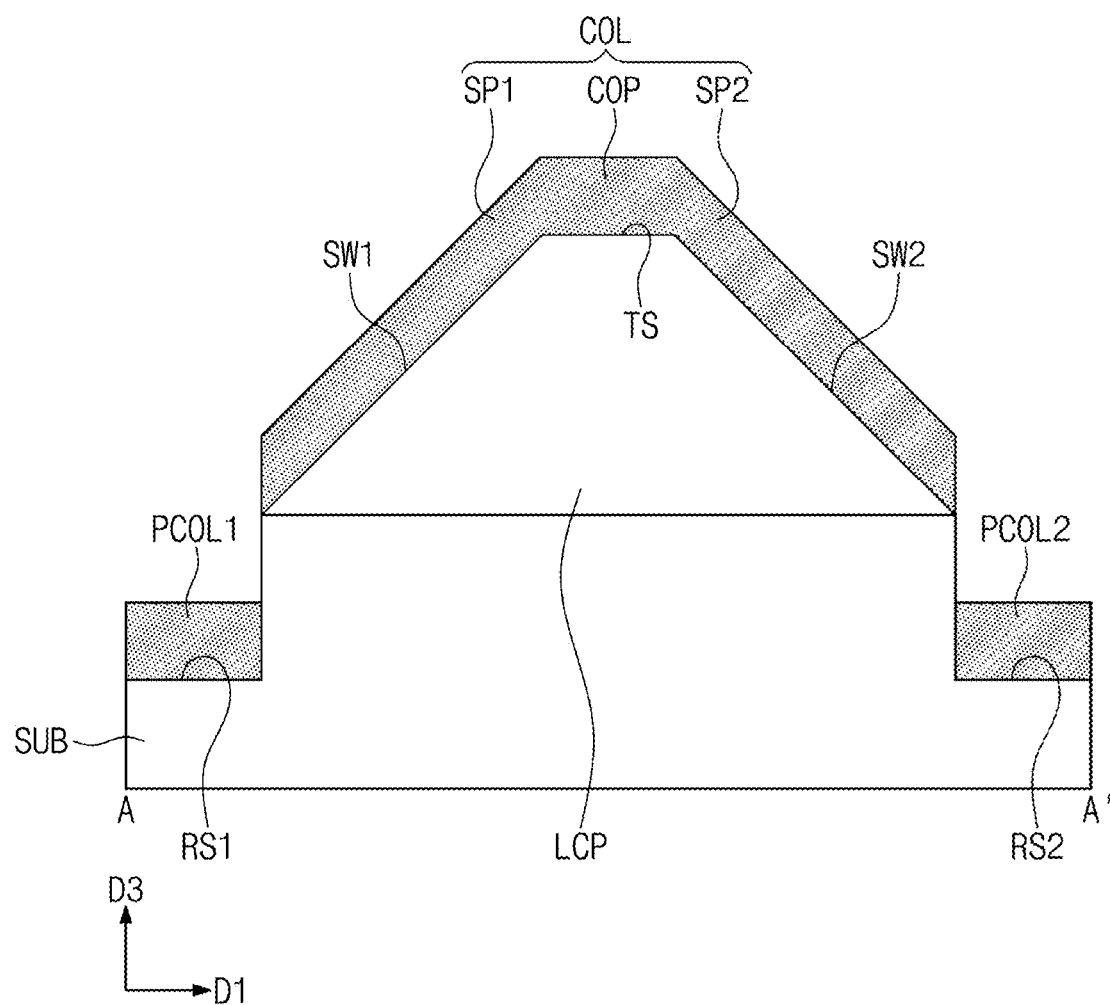

FIGS. 14 and 16 illustrate perspective views showing an optical device according to some example embodiments of the present inventive concepts. FIGS. 15 and 17 illustrate cross-sectional views taken along line A-A' of FIGS. 14 and 16, respectively. In the embodiment that follows, omission will be made to avoid repetitive detailed descriptions about technical features of the optical device discussed above with reference to FIGS. 1 and 2, and a difference thereof will be discussed in detail.

Referring to FIGS. 14 and 15, a first recess RS1 and a second recess RS2 may be defined at an upper portion of the substrate SUB. The first and second recesses RS1 and RS2 may be formed below the lower cladding pattern LCP. For example, the first and second recesses RS1 and RS2 may be respectively positioned below the first and second sidewalls SW1 and SW2 of the lower cladding pattern LCP. The first and second recesses RS1 and RS2 may extend in the second direction D2 along the lower cladding pattern LCP.

The first and second recesses RS1 and RS2 may cause that the top surface at a peripheral region of the substrate SUB is lower than the top surface at a central region of the substrate SUB. The top surface at the central region of the substrate SUB may be in contact with a bottom surface of the lower cladding pattern LCP.

First and second peripheral core layers PCOL1 and PCOL2 may be respectively provided on the first and second recesses RS1 and RS2. The first and second peripheral core layers PCOL1 and PCOL2 may include the same material as that of the core layer COL.

As discussed above, because the top surface at the peripheral region of the substrate SUB is lower than the top surface at the central region of the substrate SUB, the first and second peripheral core layers PCOL1 and PCOL2 may be spaced apart from the core layer COL.

The first and second recesses RS1 and RS2 may be formed by selectively performing a wet etching process (e.g., isotropic etching process) on the upper portion of the substrate SUB illustrated in FIG. 4. Afterwards, as discussed above in FIG. 5, an entire surface of the substrate SUB may experience a directional deposition process to form the core layer COL. While the core layer COL is formed, the first and second peripheral core layers PCOL1 and PCOL2 may be respectively formed on the first and second recesses RS1 and RS2.

Referring to FIGS. 16 and 17, a first recess RS1 and a second recess RS2 may be defined at an upper portion of the substrate SUB. The first and second recesses RS1 and RS2 may be formed by selectively performing a dry etching process (e.g., anisotropic etching process) on the upper portion of the substrate SUB illustrated in FIG. 4.

Unlike the first and second recesses RS1 and RS2 discussed above in FIGS. 15 and 16, the first and second recesses RS1 and RS2 according to the present embodiment may be formed by an anisotropic etching process in which the lower cladding pattern LCP is used as an etching mask. Therefore, the first and second recesses RS1 and RS2 according to the present embodiment may have their sidewalls that are substantially perpendicular to the top surface of the substrate SUB. A central portion of the substrate SUB may vertically overlap the lower cladding pattern LCP.

An optical device according to some embodiments of the present inventive concepts may include the core layer COL that is spaced apart from the first and second peripheral core layers PCOL1 and PCOL2 and is selectively formed only on the lower cladding pattern LCP. Because the core layer COL that guides an incident light is spaced apart from the first and second peripheral core layers PCOL1 and PCOL2, the optical device may increase in optical characteristics.

Figure 18:
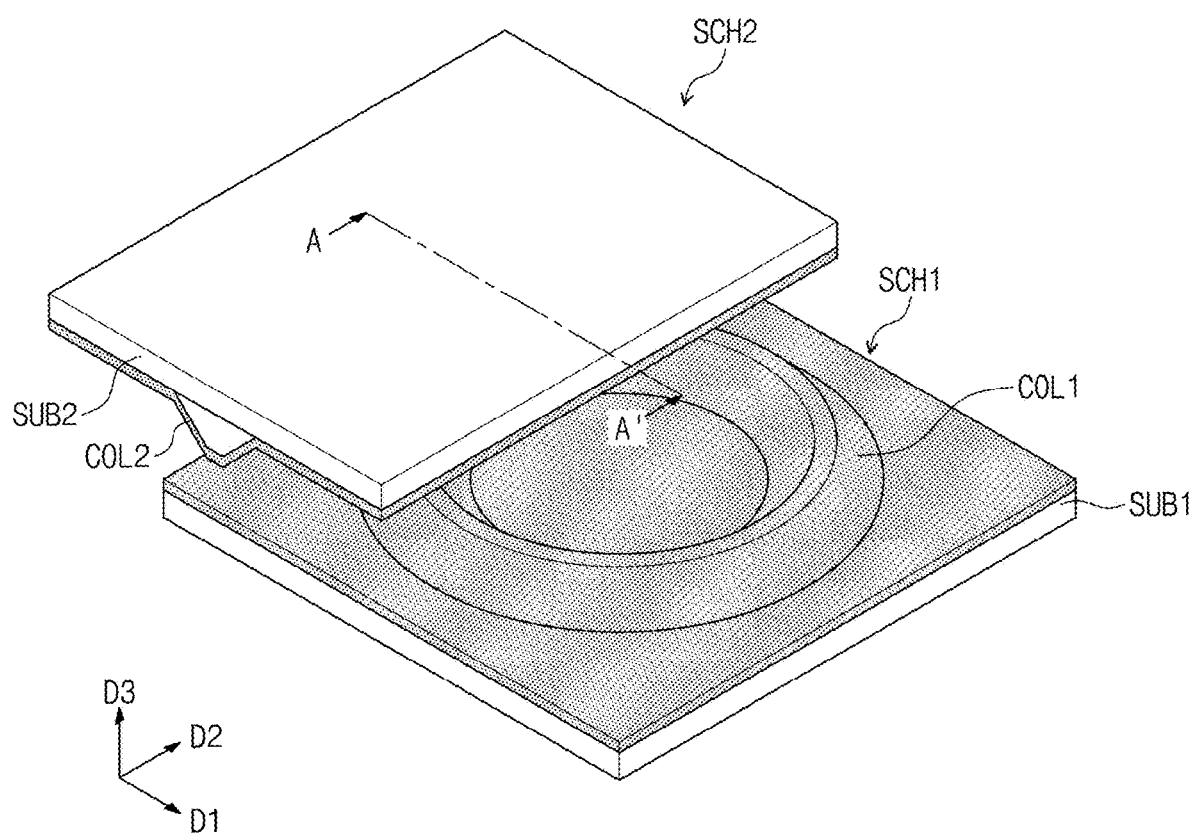
FIG. 18 illustrates a perspective view showing an optical device according to some example embodiments of the present inventive concepts.
Figure 19:
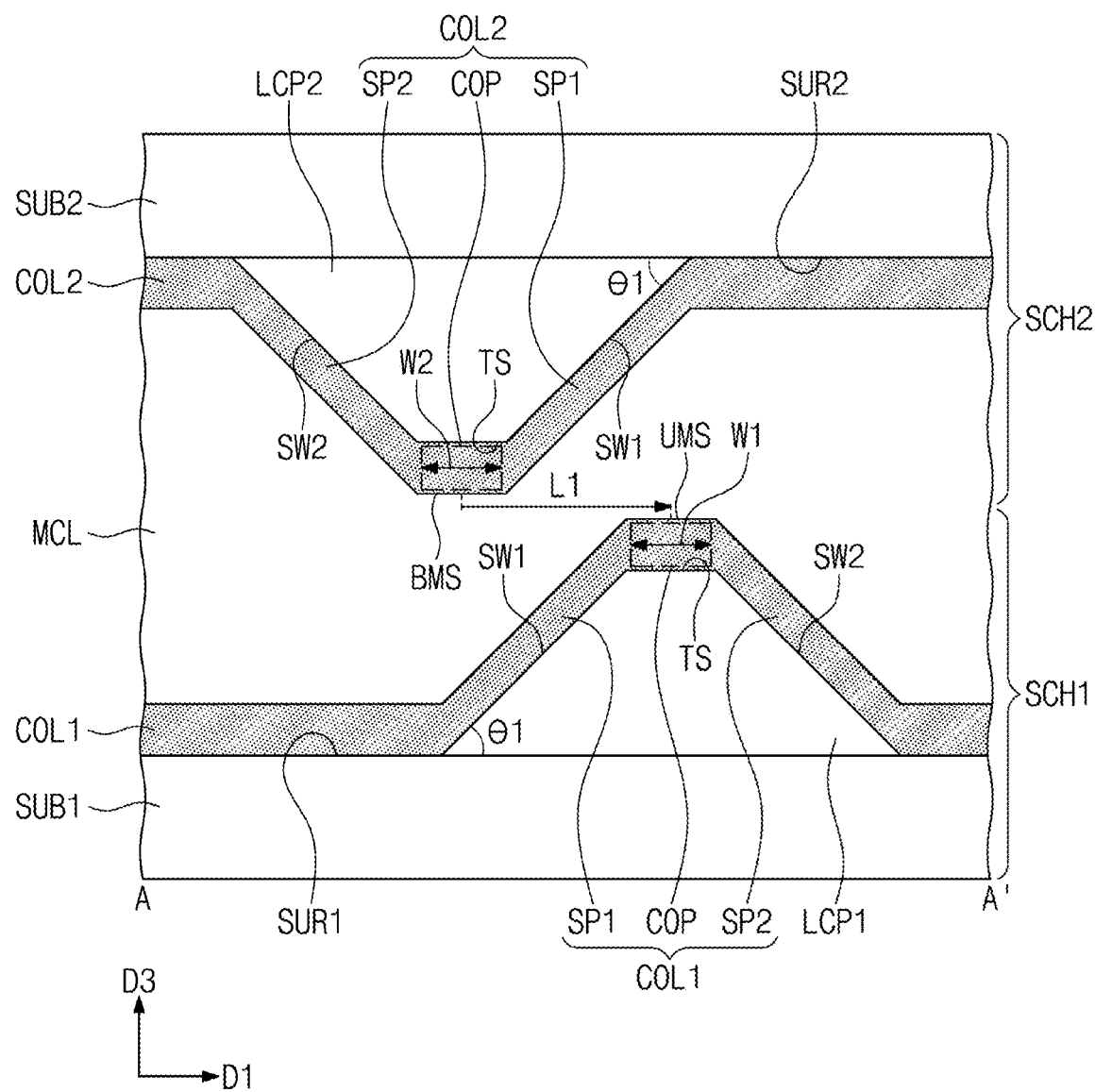
FIG. 19 illustrates a cross-sectional view taken along line A-A' of FIG. 18.

FIG. 18 illustrates a perspective view showing an optical device according to some example embodiments of the present inventive concepts. FIG. 19 illustrates a cross-sectional view taken along line A-A' of FIG. 18. In the embodiment that follows, omission will be made to avoid repetitive detailed descriptions about technical features of the optical device discussed above with reference to FIGS. 1 and 2, and a difference thereof will be discussed in detail.

Referring to FIGS. 18 and 19, an optical device according to some embodiments of the present inventive concepts may include a first sub-chip SCH1 and a second sub-chip SCH2 on the first sub-chip SCH1.

The first sub-chip SCH1 may include a ring-shaped optical resonator. For example, the first sub-chip SCH1 may include a first substrate SUB1, a first lower cladding pattern LCP1 on the first substrate SUB1, and a first core layer COL1 on the first lower cladding pattern LCP1.

When viewed in plan, the first lower cladding pattern LCP1 may have an annular shape. The first lower cladding pattern LCP1 may have a cross-section shaped like a trapezoid or a truncated pyramid. For example, the first lower cladding pattern LCP1 may have a width that decreases as approaching a second substrate SUB2 which will be discussed below.

The first core layer COL1 may include a core part COP on a top surface TS of the first lower cladding pattern LCP1, a first side part SP1 on a first sidewall SW1 of the first lower cladding pattern LCP1, and a second side part SP2 on a second sidewall SW2 of the first lower cladding pattern LCP1.

The second sub-chip SCH2 may include a linear optical waveguide. For example, the second sub-chip SCH2 may include a second substrate SUB2, a second lower cladding pattern LCP2 on the second substrate SUB2, and a second core layer COL2 on the second lower cladding pattern LCP2.

When viewed in plan, the second lower cladding pattern LCP2 may have a linear shape that extends in the second direction D2. The second lower cladding pattern LCP2 may have a cross-section shaped like a trapezoid or a truncated pyramid. For example, the second lower cladding pattern LCP2 may have a width that decreases as approaching the first substrate SUB1.

The second core layer COL2 may include a core part COP on a top surface TS of the second lower cladding pattern LCP2, a first side part SP1 on a first sidewall SW1 of the second lower cladding pattern LCP2, and a second side part SP2 on a second sidewall SW2 of the second lower cladding pattern LCP2.

The second sub-chip SCH2 may be flipped over to rest on the first sub-chip SCH1. For example, the second sub-chip SCH2 may be flip-chip mounted on the first sub-chip SCH1. The first substrate SUB1 may have a first surface SUR1 on which the first lower cladding pattern LCP1 is formed. The second substrate SUB2 may have a second surface SUR2 on which the second lower cladding pattern LCP2 is formed. Because the second sub-chip SCH2 is flipped over on the first sub-chip SCH1, the first surface SUR1 of the first substrate SUB1 may face the second surface SUR2 of the second substrate SUB2. Moreover, the top surface TS of the first lower cladding pattern LCP1 may face the second surface SUR2 of the second substrate SUB2, and the top surface TS of the second lower cladding pattern LCP2 may face the first surface SUR1 of the first substrate SUB1.

An intermediate cladding layer MCL may be interposed between the first sub-chip SCH1 and the second sub-chip SCH2. The intermediate cladding layer MCL may cover the first core layer COL1 and the second core layer COL2. For example, the intermediate cladding layer MCL may be air. For another example, the intermediate cladding layer MCL may include silicon oxide, silicon nitride, or silicon oxynitride.

In some embodiments, the first and second core layers COL1 and COL2 may include the same material as each other. For example, the first core layer COL1 may include a first chalcogenide glass, and the second core layer COL2 may include the same first chalcogenide glass as that of the first core layer COL1.

In other embodiments, the first and second core layers COL1 and COL2 may include their materials whose refractive indices are different from each other. For example, the first core layer COL1 may include a first chalcogenide glass, and the second core layer COL2 may include a second chalcogenide glass different from the first chalcogenide glass.

A portion of the core part COP of the first core layer COL1 may be adjacent to a portion of the core part COP of the second core layer COL2. Because the core part COP of the first core layer COL1 is adjacent to the core part COP of the second core layer COL2, an optical coupling caused by evanescent coupling may occur between the core parts COP of the first and second core layers COL1 and COL2.

The core part COP of the first core layer COL1 may have a first width W1 in the first direction D1, and the core part COP of the second core layer COL2 may have a second width W2 in the first direction D1. For example, the first and second widths W1 and W2 may be substantially the same as each other. For another example, the first and second widths W1 and W2 may be different from each other. The core part COP of the first core layer COL1 may be offset at a first distance L1 from the core part COP of the second core layer COL2. The first distance L1 may have a value of zero or greater than zero. In the present embodiment, the first distance L1 may be greater than each of the first and second widths W1 and W2.

The core part COP of the first core layer COL1 may have an uppermost surface UMS. The uppermost surface UMS may be parallel to the top surface TS of the first lower cladding pattern LCP1. The core part COP of the second core layer COL2 may have a lowermost surface BMS. The lowermost surface BMS may be parallel to the top surface TS of the second lower cladding pattern LCP2. The lowermost surface BMS of the second core layer COL2 may be located at a higher level than that of the uppermost surface UMS of the first core layer COL1.

A first angle θ1 may be made between the first sidewall SW1 of the first lower cladding pattern LCP1 and the first surface SUR1 of the first substrate SUB1. The first angle θ1 may be made between the first sidewall SW1 of the second lower cladding pattern LCP2 and the second surface SUR2 of the second substrate SUB2. In this sense, the first sidewall SW1 of the first lower cladding pattern LCP1 may have substantially the same inclination as that of the first sidewall SW1 of the second lower cladding pattern LCP2. Because the first sidewalls SW1 of the first and second lower cladding patterns LCP1 and LCP2 are parallel to each other, the first and second core layers COL1 and COL2 may be spaced apart from each other even when a small distance is provided between the core part COP of the first core layer COL1 and the core part COP of the second core layer COL2.

A portion of the first side part SP1 of the first core layer COL1 may be adjacent to a portion of the first side part SP1 of the second core layer COL2. For example, the first side part SP1 of the first core layer COL1 may be adjacent in the third direction D3 to the first side part SP1 of the second core layer COL2. At least a portion of the first side part SP1 of the first core layer COL1 may vertically overlap at least a portion of the first side part SP1 of the second core layer COL2.

According to the present embodiment, because the second sub-chip SCH2 is flipped over on the first sub-chip SCH1, the first lower cladding pattern LCP1 and the first core layer COL1 may have a trapezoidal cross-section, and the second lower cladding pattern LCP2 and the second core layer COL2 may have an inverse trapezoidal shape. For example, the first and second core layers COL1 and COL2 may have their structures that are geometrically engaged with each other. Therefore, it may be possible to freely control a distance between the core part COP of the first core layer COL1 and the core part COP of the second core layer COL2 with no contact between the first core layer COL1 and the second core layer COL2. In conclusion, an optical device according to the present embodiment may be configured to easily control a coupling efficiency for appropriate optical coupling. By constructing the two core parts COP to have their effective refractive indices that are similar to each other, a phase matching condition between guide modes through the core parts may be satisfied to achieve an effective optical coupling.

Figure 20:
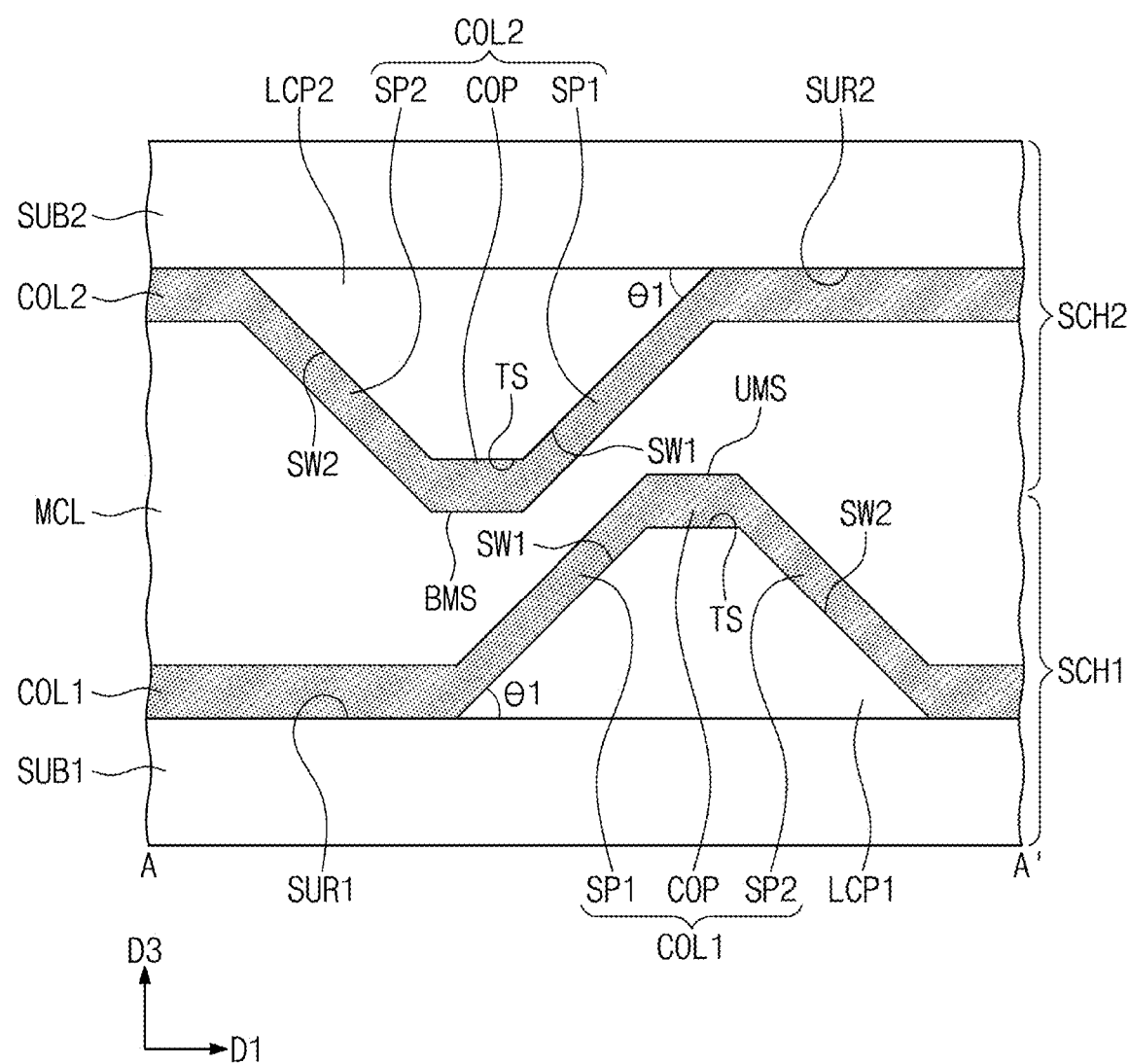
FIGS. 20, 21, and 22 illustrate cross-sectional views taken along line A-A' of FIG. 18, showing an optical device according to some example embodiments of the present inventive concepts.
Figure 21:
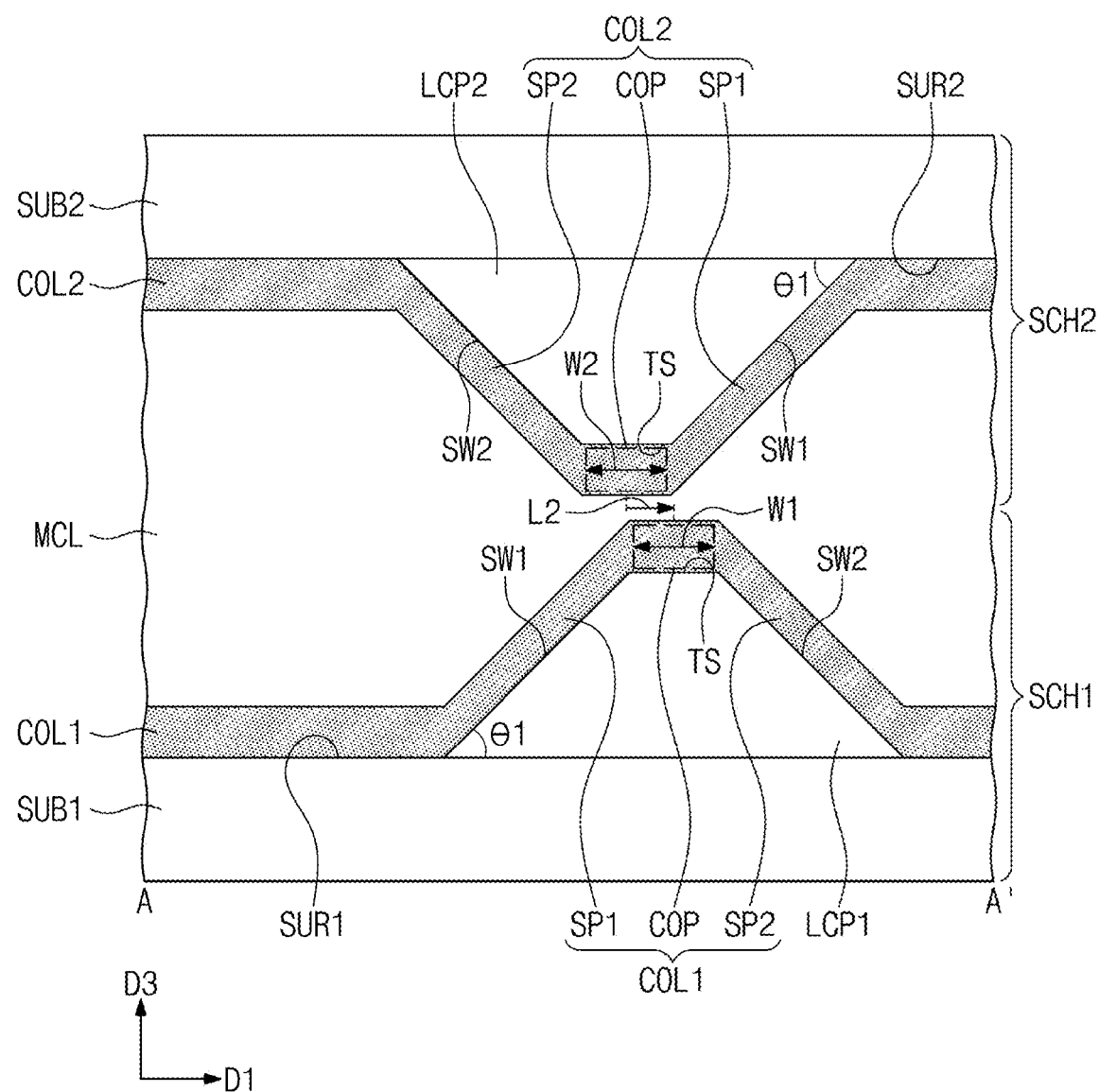
Figure 22:
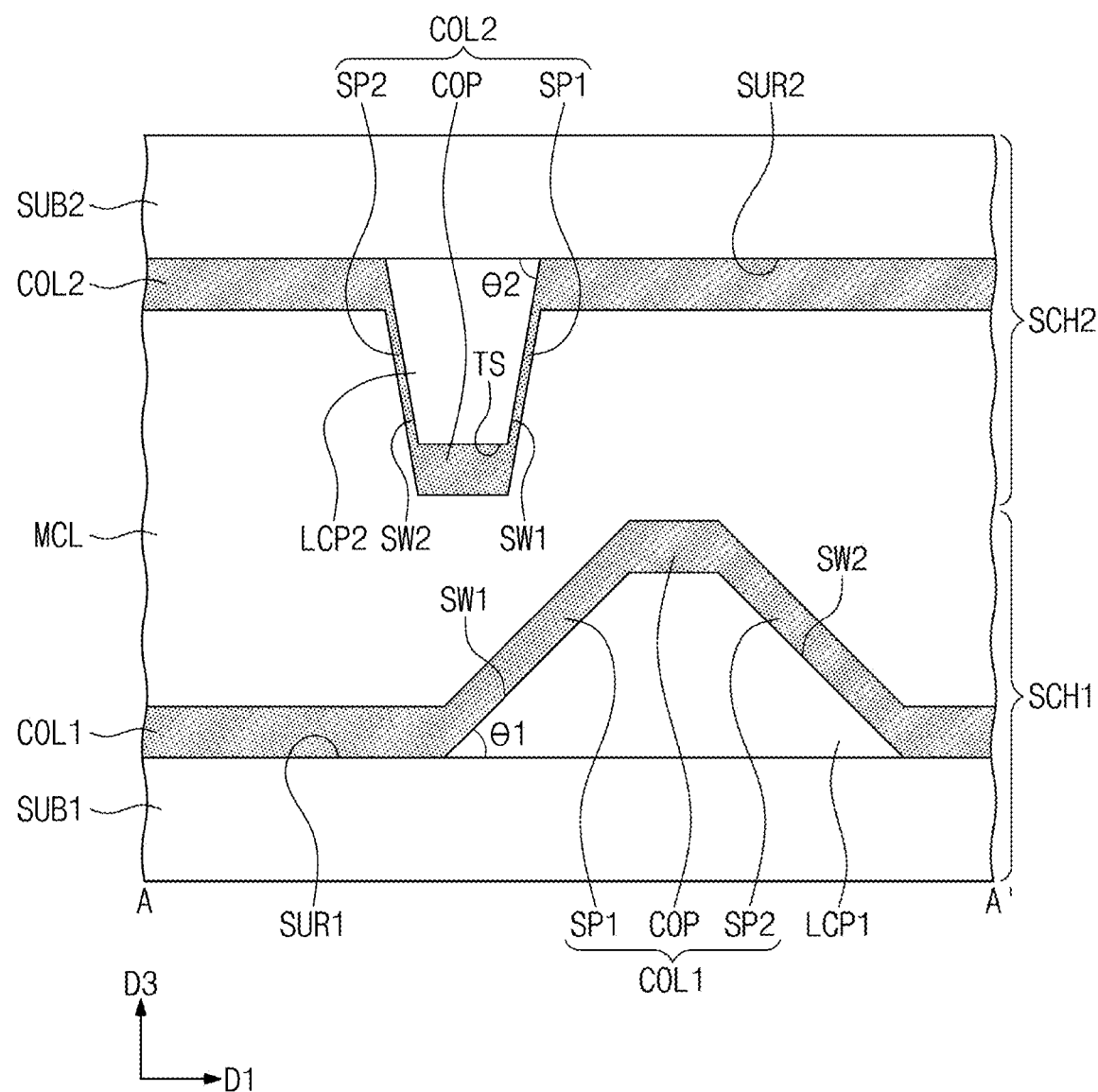

FIGS. 20, 21, and 22 illustrate cross-sectional views taken along line A-A' of FIG. 18, showing an optical device according to some example embodiments of the present inventive concepts. In the embodiment that follows, omission will be made to avoid repetitive detailed descriptions about technical features of the optical device discussed above with reference to FIGS. 18 and 19, and a difference thereof will be discussed in detail.

Referring to FIGS. 18 and 20, the uppermost surface UMS of the first core layer COL1 may be located at a higher level than that of the lowermost surface BMS of the second core layer COL2. For example, the level of the uppermost surface UMS may be higher than that of the lowermost surface BMS and lower than that of the top surface TS of the second lower cladding pattern LCP2. The level of the lowermost surface BMS may be higher than that of the top surface TS of the first lower cladding pattern LCP1 and lower than that of the uppermost surface UMS.

Referring to FIGS. 18 and 21, the core part COP of the second core layer COL2 may be adjacent in the third direction D3 to the core part COP of the first core layer COL1. The core part COP of the first core layer COL1 may be offset at a second distance L2 from the core part COP of the second core layer COL2. In the present embodiment, the second distance L2 may be less than each of the first and second widths W1 and W2. At least a portion of the core part COP of the first core layer COL1 may vertically overlap at least a portion of the core part COP of the second core layer COL2.

Referring to FIGS. 18 and 22, a first angle θ1 may be made between the first sidewall SW1 of the first lower cladding pattern LCP1 and the first surface SUR1 of the first substrate SUB1. A second angle θ2 may be made between the first sidewall SW1 of the second lower cladding pattern LCP2 and the second surface SUR2 of the second substrate SUB2. The first and second angles θ1 and θ2 may be different from each other. For example, the second angle θ2 may be greater than the first angle θ1. In this sense, the first sidewall SW1 of the second lower cladding pattern LCP2 may have an inclination greater than that of the first sidewall SW1 of the first lower cladding pattern LCP1.

For an optical device according to the present inventive concepts, a core layer similar to a ridge structure may be formed by using only a deposition process without separately performing an etching process. The core layer of the optical device according to the present inventive concepts may have an improved surface roughness, and therefore the optical device may have excellent optical characteristics.

The optical device according to the present inventive concepts may easily achieve to have a multi-layered core layer. Furthermore, first and second sub-chip may be evanescently coupled to each other in flip-chip method, and this may facilitate achievement of an optical coupler.

What is claimed is:

1. An optical device, comprising a first sub-chip and a second sub-chip flipped over on the first sub-chip, wherein
the first sub-chip includes a first substrate, a first lower cladding pattern on a first surface of the first substrate, and a first core layer on the first lower cladding pattern,
the second sub-chip includes a second substrate, a second lower cladding pattern on a second surface of the second substrate, and a second core layer on the second lower cladding pattern,
the first surface of the first substrate faces the second surface of the second substrate,
the first lower cladding pattern has a first top surface parallel to the first surface and a first sidewall inclined to the first surface, and
the first core layer includes a first core part on the first top surface and a first side part on the first sidewall.

2. The optical device of claim 1, wherein
the second lower cladding pattern has a second top surface parallel to the second surface and a second sidewall inclined to the second surface,
the second core layer includes a second core part on the second top surface and a second side part on the second sidewall, and
the first core part is adjacent to the second core part.

3. The optical device of claim 2, wherein at least a portion of the first side part vertically overlaps at least a portion of the second side part.

4. The optical device of claim 2, wherein
the first sidewall and the first surface make a first angle with each other,
the second sidewall and the second surface make a second angle with each other, and
the first angle and the second angle are substantially the same as each other.

5. The optical device of claim 2, wherein
the first sidewall and the first surface make a first angle with each other,
the second sidewall and the second surface make a second angle with each other, and
the first angle and the second angle are different from each other.

6. The optical device of claim 2, wherein a lowermost surface of the second core part is located at a level higher than a level of an uppermost surface of the first core part.

7. The optical device of claim 2, wherein a lowermost surface of the second core part is located at a level higher than a level of the first top surface and lower than a level of an uppermost surface of the first core part.

8. The optical device of claim 1, wherein
the first core part has a first thickness,
the first side part has a second thickness in a direction perpendicular to the first sidewall, and
the first thickness is greater than the second thickness.

9. The optical device of claim 8, wherein
the first core part has a first deposition thickness in a direction perpendicular to the first surface,
the first side part has a second deposition thickness in the direction perpendicular to the first surface, and
the first deposition thickness and the second deposition thickness are substantially the same as each other.

10. The optical device of claim 1, wherein at least one of the first core layer and the second core layer includes a chalcogenide glass.

11. An optical device, comprising a first sub-chip and a second sub-chip flipped over on the first sub-chip, wherein
the first sub-chip includes a first substrate, a first lower cladding pattern on a first surface of the first substrate, and a first core layer on the first lower cladding pattern,
the second sub-chip includes a second substrate, a second lower cladding pattern on a second surface of the second substrate, and a second core layer on the second lower cladding pattern,
the first surface of the first substrate faces the second surface of the second substrate,
a width of the first lower cladding pattern decreases as approaching the second substrate,
a width of the second lower cladding pattern decreases as approaching the first substrate, and
a core part of the first core layer is adjacent to a core part of the second core layer.

12. The optical device of claim 11, wherein an optical coupling occurs between the core part of the first core layer and the core part of the second core layer.

13. The optical device of claim 11, wherein
the first core layer includes the core part on a top surface of the first lower cladding pattern and a side part on a sidewall of the first lower cladding pattern,
the core part has a first thickness,
the side part has a second thickness in a direction perpendicular to the sidewall of the first lower cladding pattern, and
the first thickness is greater than the second thickness.
14. The optical device of claim 13, wherein
the core part has a first deposition thickness in a direction perpendicular to the first surface,
the side part has a second deposition thickness in the direction perpendicular to the first surface, and
the first deposition thickness and the second deposition thickness are substantially the same as each other.
15. The optical device of claim 11, wherein
the core part of the first core layer has a first width in a first direction,
the core part of the second core layer has a second width in the first direction,
the core part of the first core layer is offset in the first direction at a first distance from the core part of the second core layer, and
the first distance is greater than the first width.
16. The optical device of claim 11, wherein
the core part of the first core layer has a first width in a first direction,
the core part of the second core layer has a second width in the first direction,
the core part of the first core layer is offset in the first direction at a first distance from the core part of the second core layer, and
the first distance is less than the first width.

17. An optical device, comprising:
a lower cladding pattern on a substrate; and
a core layer on the lower cladding pattern,
wherein
the lower cladding pattern has a top surface parallel to a top surface of the substrate and a sidewall inclined to the top surface of the substrate,
the core layer has a core part on the top surface of the lower cladding pattern and a side part on the sidewall of the lower cladding pattern,
the core layer includes a first core layer, a second core layer and a two-dimensional material layer between the first and the second core layers,
the first core layer of the core part has a first thickness,
the first core layer of the side part has a second thickness in a direction perpendicular to the sidewall, and
the first thickness is greater than the second thickness.
18. The optical device of claim 17, wherein
the second core layer of the core part has a third thickness,
the second core layer of the side part has a fourth thickness in the direction perpendicular to the sidewall,
the third thickness is greater than the fourth thickness.
19. The optical device of claim 17, wherein
the second core layer of the core part has a third thickness,
the second core layer of the side part has a fourth thickness in the direction perpendicular to the sidewall, and
the third thickness and the fourth thickness are substantially the same as each other.
20. The optical device of claim 17, further comprising:
a peripheral core layer on a recess defined at an upper portion of the substrate,
wherein the peripheral core layer is spaced apart from the core layer.

* * * * *